(12) United States Patent
Amo

(10) Patent No.: US 10,205,006 B2
(45) Date of Patent: Feb. 12, 2019

(54) METHOD FOR MANUFACTURING SEMICONDUCTOR DEVICE INCLUDING PATTERNING CONDUCTOR FILM DISPOSED ON INSULATING FILM

(71) Applicant: Renesas Electronics Corporation, Tokyo (JP)

(72) Inventor: Atsushi Amo, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/951,552

(22) Filed: Apr. 12, 2018

(65) Prior Publication Data

US 2018/0233587 A1 Aug. 16, 2018

Related U.S. Application Data

(63) Continuation of application No. 15/417,050, filed on Jan. 26, 2017, now Pat. No. 9,947,776.

(30) Foreign Application Priority Data

Mar. 22, 2016 (JP) ................. 2016-056819

(51) Int. Cl.
*H01L 29/66* (2006.01)
*H01L 29/792* (2006.01)
(Continued)

(52) U.S. Cl.
CPC .... *H01L 29/66833* (2013.01); *H01L 23/5223* (2013.01); *H01L 27/0629* (2013.01);
(Continued)

(58) Field of Classification Search
CPC ............ H01L 29/401; H01L 29/66477; H01L 29/66545; H01L 23/5223; H01L 27/0629;
(Continued)

(56) References Cited

U.S. PATENT DOCUMENTS 7,015,090 B2  3/2006 Okazaki et al.
9,318,500 B2  4/2016 Shinohara
(Continued)

FOREIGN PATENT DOCUMENTS

JP  2003-309182 A  10/2003
JP  2014-154789 A  8/2014

OTHER PUBLICATIONS

Office Action in U.S. Appl. No. 15/417,050 dated Sep. 26, 2017.
Notice of Allowance in U.S. Appl. No. 15/417,050 dated Dec. 15, 2017.

*Primary Examiner* — Thanh Y Tran
(74) *Attorney, Agent, or Firm* — McGinn I.P. Law Group, PLLC.

(57) ABSTRACT

A method of manufacturing a semiconductor device includes providing a semiconductor substrate including a main surface, the main surface including a first area and a second area, which is different from the first area in a plan view, forming a first trench in the main surface of the semiconductor substrate in the first area, after the forming the first trench, forming a first insulating film on a side wall surface and a bottom face of the first trench, and after the forming the first insulating film, forming a first conductor film over the semiconductor substrate in the first area and a second area to embed a portion of the first conductor film into the first trench through the first insulating film.

19 Claims, 32 Drawing Sheets

(51) Int. Cl.
    *H01L 27/11568*     (2017.01)
    *H01L 27/06*     (2006.01)
    *H01L 23/522*     (2006.01)
    *H01L 29/40*     (2006.01)
    *H01L 27/11582*     (2017.01)
    *H01L 49/02*     (2006.01)

(52) U.S. Cl.
    CPC .. *H01L 27/11568* (2013.01); *H01L 27/11582* (2013.01); *H01L 28/00* (2013.01); *H01L 29/401* (2013.01); *H01L 29/66545* (2013.01); *H01L 29/792* (2013.01)

(58) Field of Classification Search
    CPC ......... H01L 27/11573; H01L 29/42344; H01L 29/66833; H01L 29/792; H01L 27/1157
    See application file for complete search history.

(56) References Cited

U.S. PATENT DOCUMENTS

| | | | |
|---|---|---|---|
| 9,755,086 B2 * | 9/2017 | Amo | H01L 29/66833 |
| 9,947,776 B2 * | 4/2018 | Amo | H01L 29/66833 |
| 2016/0064389 A1 * | 3/2016 | Mihara | H01L 27/1157 257/314 |
| 2016/0064507 A1 * | 3/2016 | Amo | H01L 29/4975 257/314 |

* cited by examiner

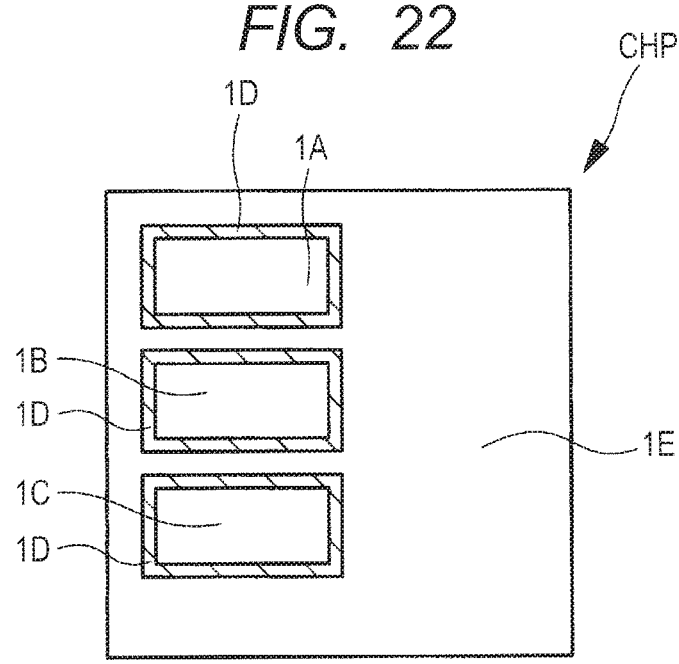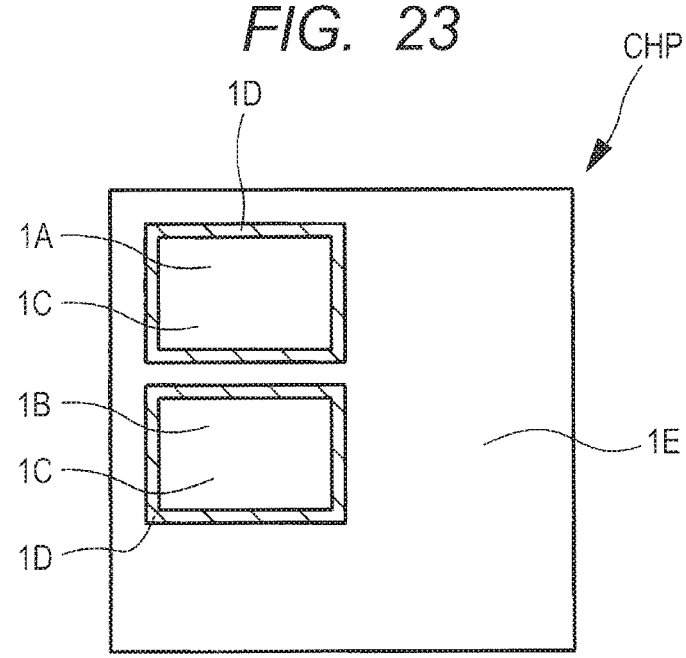

FIG. 24

| | OPERATION SYSTEM WRITE-IN/ERASE | WRITE-IN OPERATION VOLTAGE (V) Vmg/Vs/Vcg/Vd/Vb | ERASE OPERATION VOLTAGE (V) Vmg/Vs/Vcg/Vd/Vb | READ-OUT OPERATION VOLTAGE (V) Vmg/Vs/Vcg/Vd/Vb |
|---|---|---|---|---|
| A | SSI (WRITE-IN)/ BTBT (ERASE) | 10/5/1/0.5/0 | -6/6/0/open/0 | 0/0/1.5/1.5/0 |
| B | SSI (WRITE-IN)/ FN (ERASE) | 10/5/1/0.5/0 | 12/0/0/0/0 | 0/0/1.5/1.5/0 |
| C | FN (WRITE-IN)/ BTBT (ERASE) | -12/0/0/0/0 | -6/6/0/open/0 | 0/0/1.5/1.5/0 |
| D | FN (WRITE-IN)/ FN (ERASE) | -12/0/0/0/0 | 12/0/0/0/0 | 0/0/1.5/1.5/0 |

METHOD FOR MANUFACTURING SEMICONDUCTOR DEVICE INCLUDING PATTERNING CONDUCTOR FILM DISPOSED ON INSULATING FILM

The present application is a Continuation application of U.S. patent application Ser. No. 15/417,050, filed on Jan. 26, 2017, which is based on and claims priority from Japanese Patent Application No. 2016-056819, filed on Mar. 22, 2016, the entire contents of which are incorporated herein by reference.

BACKGROUND

The present invention relates to a method for manufacturing a semiconductor device, and is available for, for example, manufacture of a semiconductor device having a nonvolatile memory and a capacitive element.

An EEPROM (Electrically Erasable and Programmable Read Only Memory) has widely been used as an electrically writable and erasable nonvolatile semiconductor memory device. Such a memory device has a conductive floating gate electrode or a trapping insulation film surrounded by an oxide film beneath a gate electrode of a MISFET and holds a charge storage state at the floating gate electrode or the trapping insulation film as memory information and reads out it as a threshold value of a transistor.

The trapping insulation film refers to an insulating film capable of accumulating an electric charge and may include a silicon nitride film or the like as an example. The threshold value of the MISFET is shifted by injection/discharge of the electric charge into/from such a charge storage region to operate the trapping insulation film as a memory element. As the nonvolatile semiconductor memory device using the trapping insulation film, there is known a split gate-type cell using a MONOS (Metal Oxide Nitride Oxide Semiconductor) film.

Further, as a method for forming a gate electrode, there is known a so-called gate last process in which after a dummy gate electrode is formed over a substrate, the dummy gate electrode is replaced with a metal gate electrode or the like. When the gate last process is used, it is difficult to form a capacitive element in which a lower electrode is formed at the same height as the gate electrode and an upper electrode is provided over the lower electrode.

On the other hand, if a capacitive element is used in which a semiconductor substrate is used as a lower electrode and an upper electrode is formed at the same height as a gate electrode, it can be mixedly mounted over the semiconductor substrate together with a memory element or the like formed using the gate last process. In such a capacitive element, a part of the upper electrode is embedded into a trench formed in a main surface of the semiconductor substrate to enable a facing area between the upper electrode and the semiconductor substrate to increase, thereby making it possible to increase the capacity of the capacitive element.

Patent Document 1 (Japanese Unexamined Patent Application Publication No. 2014-154789) has described that a memory cell and a MISFET having a metal gate electrode are formed by using a gate last process.

Patent Document 2 (Japanese Unexamined Patent Application Publication No. 2003-309182) has described that in a capacitive element which generates a capacity between a substrate and an electrode provided over the substrate, a part of the electrode is embedded into a trench defined in an upper surface of the substrate.

SUMMARY

When an insulating film which separates an upper electrode and a lower electrode of a capacitive element from each other, and a gate insulating film of a high breakdown voltage MISFET are respectively formed by separate processes where a capacitive element in which a part of its electrode is embedded into a trench defined in a main surface of a semiconductor substrate, a MONOS memory, and a high breakdown voltage MISFET are formed over the same semiconductor substrate, a problem arises in that a manufacturing process of a semiconductor device becomes complex, and hence the manufacturing cost thereof is increased.

Other objects and novel features of the present invention will become apparent from the description of the present specification and the accompanying drawings.

A summary of a typical one of embodiments disclosed in the present application will be described in brief as follows:

A method for manufacturing a semiconductor device showing one embodiment is adapted to form an insulating film between electrodes of a capacitive element and a gate insulating film of a high breakdown voltage transistor by the same insulating film.

According to one embodiment, it is possible to reduce the manufacturing cost of a semiconductor device.

BRIEF DESCRIPTION OF THE DRAWINGS

FIG. 22 is a plan diagram in the process of manufacturing the semiconductor device showing the embodiment 1;

FIG. 23 is a plan diagram in the process of manufacturing a semiconductor device showing a modification of the embodiment 1;

FIG. 24 is a table showing one example of conditions for application of voltages to respective parts of a selected memory cell at the time of "write-in", "erase", and "read-out";

DETAILED DESCRIPTION

Figure 1:
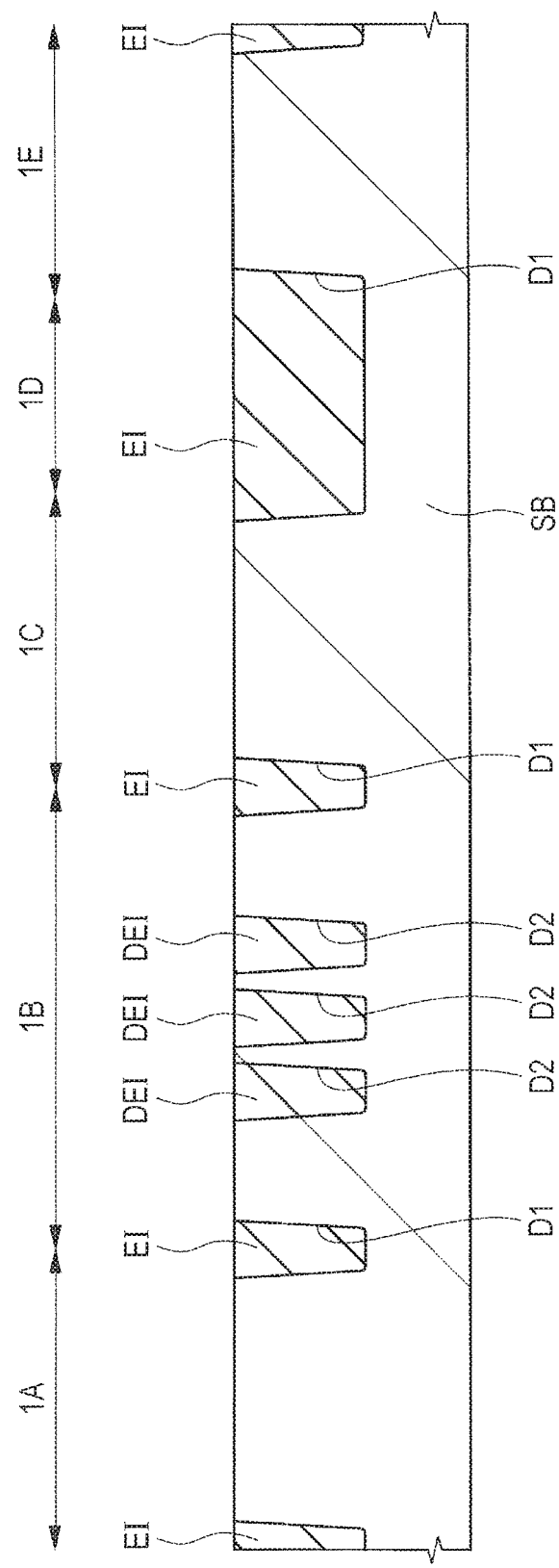
FIG. 1 is a sectional diagram in the process of manufacturing a semiconductor device showing an embodiment 1.

Preferred embodiments will hereinafter be described in detail based on the accompanying drawings. Incidentally, in all of the drawings for explaining the embodiments, the same reference numerals are respectively attached to members having the same function, and their repetitive description will be omitted. Further, in the following embodiments, the description of the same or like parts will not be repeated in principle except when required in particular.

Embodiment 1

Semiconductor devices according to the present embodiment and the following embodiments are semiconductor devices each equipped with a nonvolatile memory (nonvolatile memory element, flash memory, nonvolatile semiconductor memory device), a capacitive element, a low breakdown voltage transistor, and a high breakdown voltage transistor. In the present embodiment and the following embodiments, the nonvolatile memory will be described on the basis of a memory cell based on an n channel type MISFET (MISFET: Metal Insulator Semiconductor Field Effect Transistor).

Further, the polarities (polarity of applied voltage at the time of write-in, erase, and read-out and polarity of carrier) in the present embodiment and the following embodiments are for describing the operation of the memory cell based on the n channel type MISFET. When it is based on a p channel type MISFET, the same operation can be obtained in principle by inverting all polarities of a potential to be applied, a conductivity type of a carrier, etc.

<Manufacturing Method of Semiconductor Device>

A method for manufacturing the semiconductor device according to the present embodiment will be described with reference to FIG. 1 through FIG. 22.

FIG. 1 through FIG. 21 are sectional diagrams in the process of manufacturing the semiconductor device according to the present embodiment. FIG. 22 is a plan diagram in the process of manufacturing a semiconductor chip which is the semiconductor device according to the present embodiment.

FIG. 1 through FIG. 21 respectively show cross sections of a memory cell area 1A, a capacitive element area 1B, a high breakdown voltage transistor area 1C, a boundary area 1D, and a low breakdown voltage transistor area 1E in order from the left to right sides in the respective drawings.

In the following description, there is shown the manner in which a memory cell of a nonvolatile memory is formed in the memory cell area 1A, a trench type capacitive element is formed in the capacitive element area 1B, a high breakdown voltage MISFET is formed in the high breakdown voltage transistor area 1C, and a low breakdown voltage MISFET is formed in the low breakdown voltage transistor area 1E, respectively. The memory cell area 1A, the capacitive element area 1B, the high breakdown voltage transistor area 1C, the boundary area 1D, and the low breakdown voltage transistor area 1E exist in the upper surface of a semiconductor substrate in a forming area of a semiconductor chip as will be described later using FIG. 22. As will be described later using FIG. 22, the boundary area 1D is, for example, an area between the memory cell area LA, the capacitive element area 1B or the high breakdown voltage transistor area 1C and the other peripheral circuit area (e.g., low breakdown voltage transistor area 1E). In the following description, there is shown the manner in which a gate electrode-like pattern which does not form a circuit is formed in the boundary area 1D.

The memory cell area 1A, the capacitive element area 1B, the high breakdown voltage transistor area 1C, the boundary area 1D, and the low breakdown voltage transistor area 1E are respectively areas arranged along a main surface of the semiconductor substrate. That is, the main surface of the semiconductor substrate has the memory cell area 1A, the capacitive element area 1B, the high breakdown voltage transistor area 1C, the boundary area 1D, and the low breakdown voltage transistor area 1E.

Although a description will be made here of a case where n channel type MISFETs (control transistor and memory transistor) are formed in the memory cell area 1A, p channel type MISFETs (control transistor and memory transistor) can also be formed in the memory cell area 1A by inverting their conductivity types. Similarly, although a description will be made here of a case where n channel type MISFETs are formed in the high breakdown voltage transistor area 1C and the low breakdown voltage transistor 1E, p channel type MISFETs can also be formed by inverting their conductivity types.

Also, for example, both of the n channel type MISFET and the p channel type MISFET, i.e., CMISFETs (Complementary Metal Insulator Semiconductors) can also be formed in the high breakdown voltage transistor area 1C or the low breakdown voltage transistor area 1B.

Further, although a description will be made here of a case in which a capacitive element including a lower electrode (first electrode) including an n type well in the main surface of the semiconductor substrate, and an upper electrode (second electrode) included an n type semiconductor film formed over the semiconductor substrate is formed in the capacitive element area 1B, a capacitive element including a lower electrode including a p type well and an upper electrode included a p type semiconductor film may be formed.

In the manufacturing process of the semiconductor device, first, as shown in FIG. 1, a semiconductor substrate (semiconductor wafer) SB included p-type monocrystalline silicon (Si) or the like having a specific resistance of about 1 to 100 cm is provided. Following the above, a hard mask included an insulating film is formed over the main surface of the semiconductor substrate SB, and dry etching is performed using the hard mask to thereby remove a part of the upper surface of the semiconductor substrate SB. The hard mask is included, for example, a silicon oxide film and a silicon nitride film formed in order over the semiconductor substrate SB.

Thus, a plurality of trenches (concave portions, recessed portions) D1 are formed in their corresponding upper surfaces of the semiconductor substrate SB in the memory cell area 1A, the capacitive element area 1B, the high breakdown voltage transistor area 1C, the boundary area 1D, and the low breakdown voltage transistor area 1E. Further, a plurality of trenches D2 are formed in the upper surface of the semiconductor substrate SB in the capacitive element area 1B.

Each trench D2 extends in a first direction along the main surface of the semiconductor substrate SB. The trenches D2 are arranged side by side along the main surface of the semiconductor substrate SB and in a second direction orthogonal to the first direction. That is, the trenches D2 are respectively formed in stripes as viewed in a plane. Incidentally, the layout of each trench D2 is not limited to the strip form, but may be a dot shape or a parallel cross shape or the like. The trenches D1 and D2 are concave portions formed in the same process and reach a depth on the way of the semiconductor substrate SB.

Subsequently, after the side walls of the trenches D1 and D2 are oxidized, a silicon oxide film is formed over the semiconductor substrate SB by using, for example, a CVD method to completely fill the inner sides of the trenches D1 and D2, followed by execution of heat treatment to tightly bake the silicon oxide film. Afterwards, the upper surface of the silicon oxide film is polished by a CMP (Chemical Mechanical Polishing) method to expose the upper surface of the semiconductor substrate SB and the hard mask (not shown) lying over the upper surface thereof from the silicon oxide film. Thus, the silicon oxide films embedded inside the trenches D1 and D2 respectively are respectively separated. Afterwards, the upper surface of the silicon oxide film is etched back and thereby retreated.

Thus, an element isolation region EI included the silicon oxide film is formed in each trench D1. A dummy element isolation region DEI included the silicon oxide film is formed in each trench D2. The dummy element isolation region DEI is a pseudo element isolation region removed in a subsequent process. In the memory cell area 1A, the capacitive element area 1B, the high breakdown voltage transistor area 1C, and the low breakdown voltage transistor area 1E, the main surface of the semiconductor substrate SB is exposed from the element isolation region EI, whereas in the boundary area 1D, the whole main surface of the semiconductor substrate SB is covered with the element isolation region EI. Thereafter, the hard mask is removed by, for example, a wet etching method.

Figure 2:
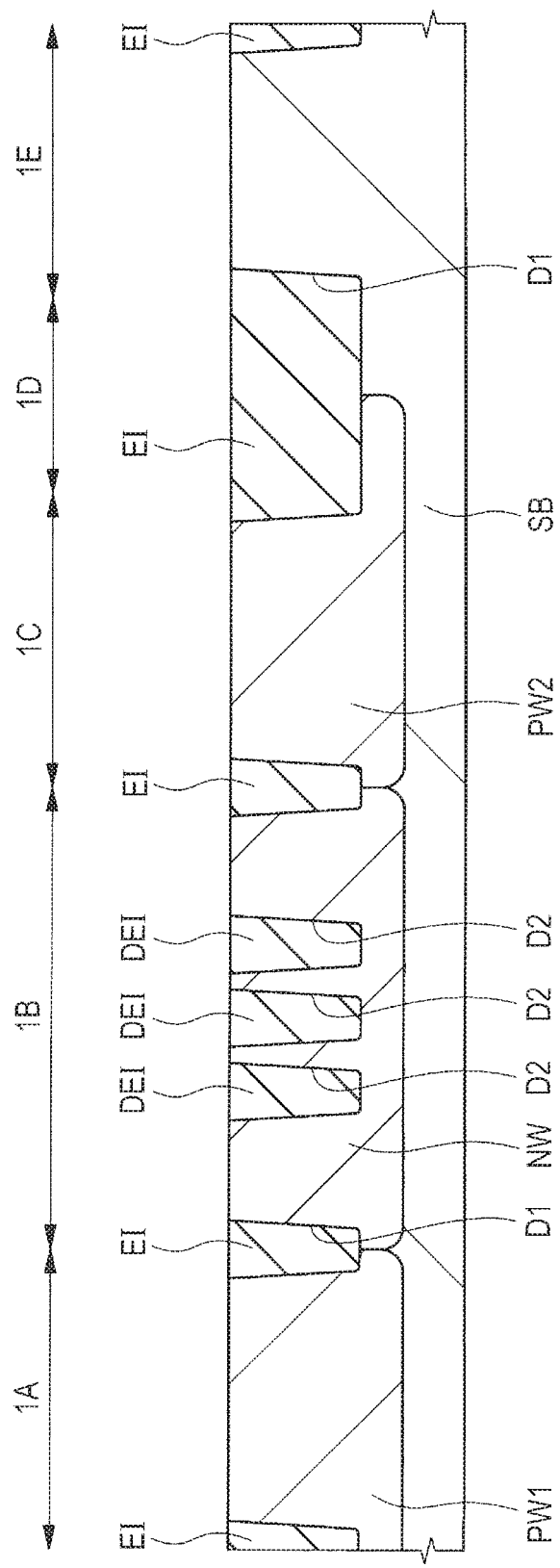
FIG. 2 is a sectional diagram following FIG. 1 in the process of manufacturing the semiconductor device.

Next, as shown in FIG. 2, by using a photolithography technique and an ion implantation method, wells PW1 and PW2 each being a p-type semiconductor region are respectively formed in the main surface of the semiconductor substrate SB in the memory cell area 1A and the high breakdown voltage transistor area 1C. Here, the wells PW1 and PW2 are formed by implanting a p-type impurity (e.g., B (boron)) into the main surface of the semiconductor substrate SB at a relatively low concentration. Incidentally, in the area of forming a p type MISFET, although not illustrated and described in detail, an n-type impurity (e.g., As (arsenic) or P (phosphorus)) is ion-implanted into the main surface of the semiconductor substrate SB to form an n-type well. Incidentally, a well in the low breakdown voltage transistor area 1E is formed in a subsequent process.

The respective formed depths of the wells PW1 and PW2 are deeper than the trenches D1 and D2. Here, the wells PW1 and PW2 are respectively made different in impurity concentration by forming them by separate ion implantation processes using the photolithography technique.

Subsequently, a good NW being an n-type semiconductor region is formed in the main surface of the semiconductor substrate SB in the capacitive element area 1B by using the photolithography technique and the ion implantation method. Here, the good NW is formed by implanting an n-type impurity (e.g., As (arsenic) or P (phosphorus)) into the main surface of the semiconductor substrate SB at a relatively low concentration. The formed depth of the good NW is deeper than the trenches D1 and D2. Afterwards, the semiconductor substrate SB is heat-treated to diffuse the impurities in the wells PW1 and PW2 and NW. Incidentally, any of the wells PW1, PW2, and NW may be formed previously.

Figure 3:
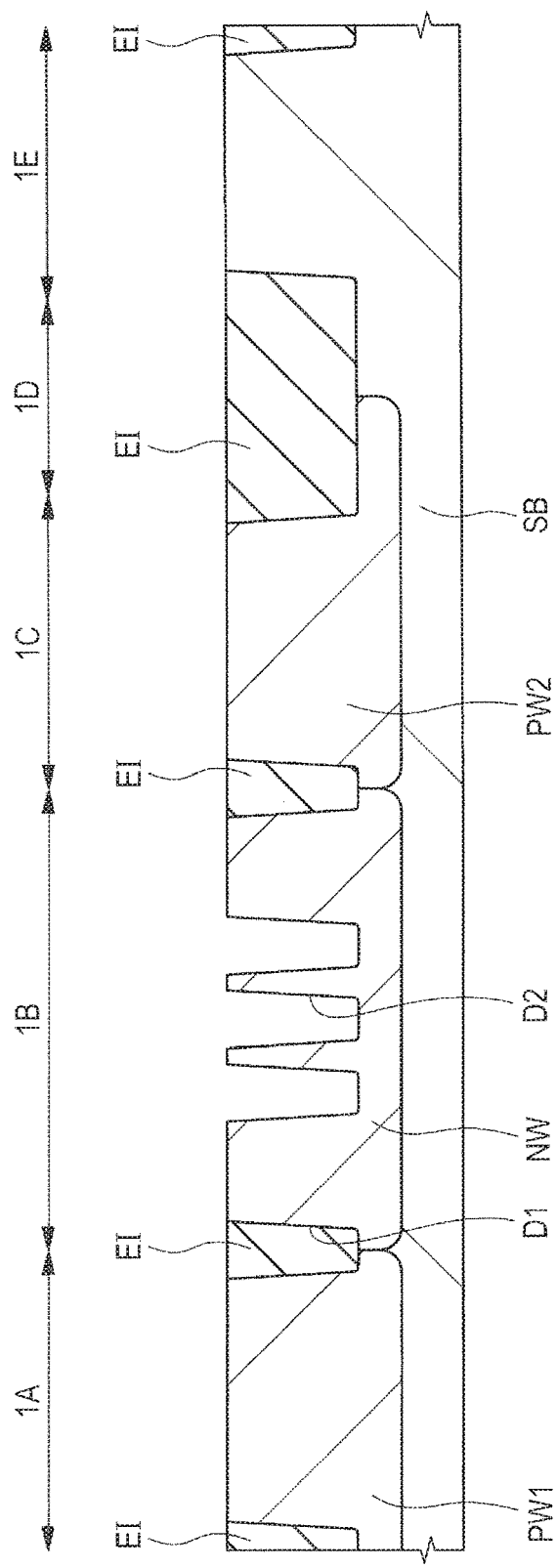
FIG. 3 is a sectional diagram following FIG. 2 in the process of manufacturing the semiconductor device.

Next, as shown in FIG. 3, dry etching or wet etching is performed using a photoresist film (not shown) covering the element isolation region EI and exposing the capacitive element area 1B as a mask to thereby remove the dummy element isolation region DEI in each trench D2. Thus, the bottom face and side walls of the trench D2 are exposed.

Figure 4:
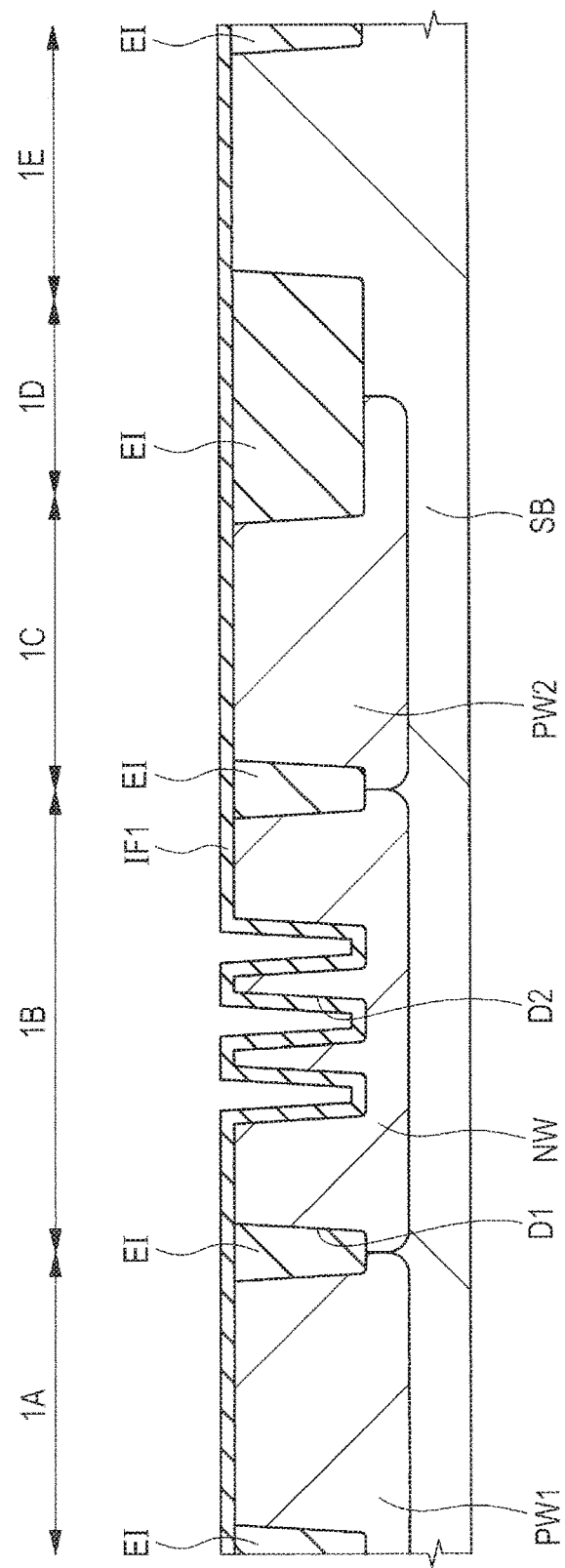
FIG. 4 is a sectional diagram following FIG. 3 in the process of manufacturing the semiconductor device.

Next, as shown in FIG. 4, an insulating film IF1 relatively large in thickness is formed over the semiconductor substrate SB. The insulating film IF1 is formed in at least the memory cell area 1A, the capacitive element area 1B, the high breakdown voltage transistor area 1C, and the low breakdown voltage transistor area 1E and covers the upper surface of the semiconductor substrate SB and the side walls and bottom face of each trench D2. Here, the insulating film IF1 is illustrated as covering even the upper surface of the element isolation region EI in each area.

Since the insulating film IF1 is a film which serves as a gate insulating film of a high breakdown voltage transistor to be formed later and an isolation insulating film (gate insulating film) between electrodes of a capacitive element, it needs to have a breakdown voltage performance of about 5 to 12V. Thus, the thickness of the insulating film IF1 needs to be about 15 to 20 nm. Here, the thickness of the insulating film IF1 is 16 nm, for example.

The insulating film IF1 is included, for example, a silicon oxide film. The insulating film IF1 can be formed by, for example, a dry oxidation method, a wet oxidation method or an ISSG (In-Situ Steam Generation) oxidation method. Also, the insulating film IF1 may be formed by, for example, a CVD (Chemical Vapor Deposition) method. In this case, the insulating film IF1 is included, for example, a TEOS (Tetra Ethyl Ortho Silicate) film or an HTO (High-temperature silicon oxide) film. Further, the insulating film IF1 may be formed by combining any of the above oxidation methods with the CVD method. In this case, for example, first, after an insulating film having a thickness of 5 nm is formed by an oxidation method, an insulating film having a thickness of 10 nm is deposited thereon by the CVD method to form an insulating film IF1 having a laminated structure included those insulating films.

The insulating film IF1 covers the side walls and bottom face of each trench D2, but does not completely cover each trench D2. That is, the width of the trench D2 in the second direction, i.e., the width of the trench D2 in its lateral direction is larger than twice the thickness of the insulating film IF1.

Figure 5:
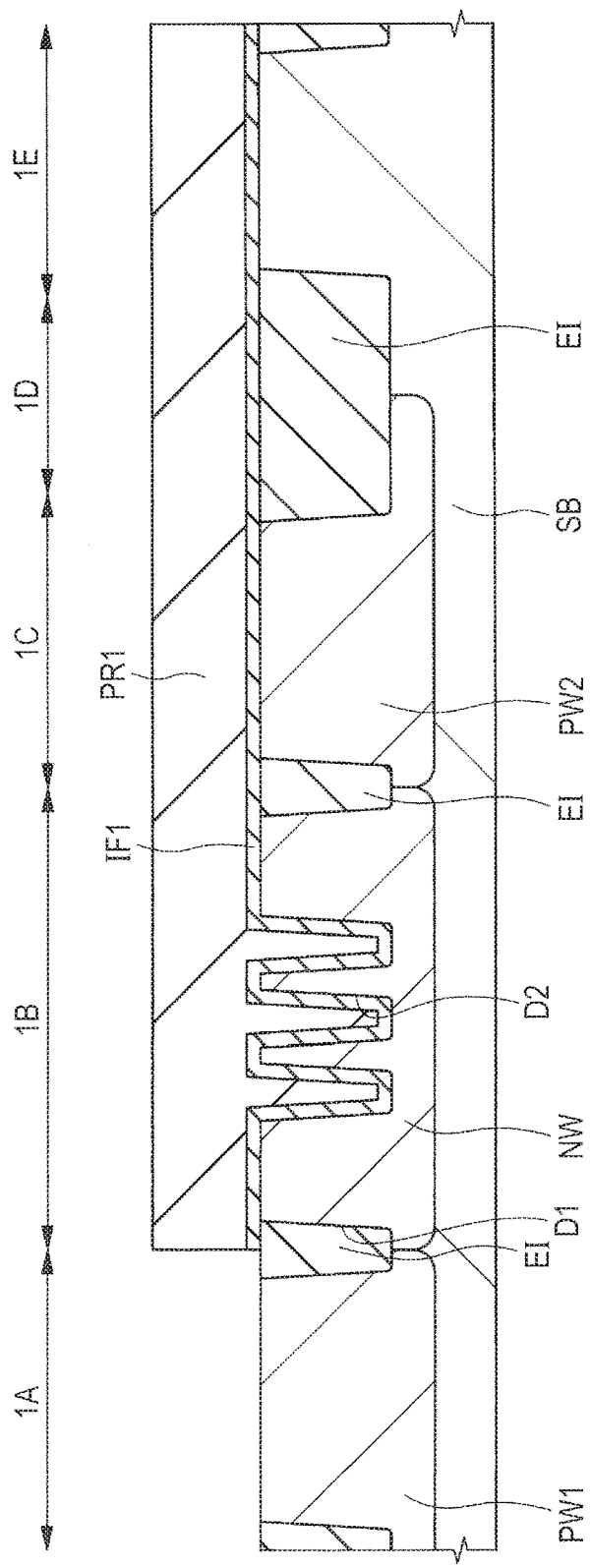
FIG. 5 is a sectional diagram following FIG. 4 in the process of manufacturing the semiconductor device.

Next, as shown in FIG. 5, a pattern included a photoresist film PR1 is formed using the photolithography technique. Afterwards, etching is performed with the pattern as a mask to remove the insulating film IF1 in the memory cell area 1A. Thus, the main surface of the semiconductor substrate SB in the memory cell area 1A is exposed. At this time, the insulating film IF1 in the low breakdown voltage transistor area 1E may be removed. A description will however be made about a case where the insulating film IF1 in the low breakdown voltage transistor area 1E is left in the corresponding etching process.

Figure 6:
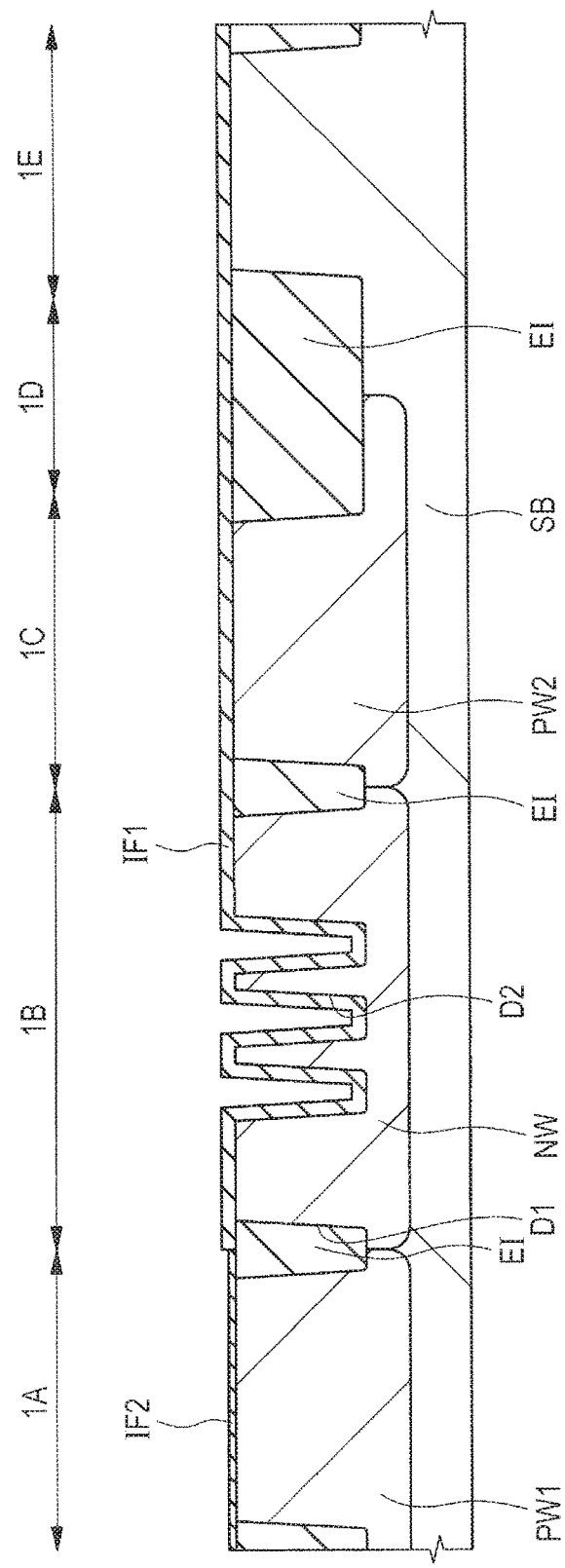
FIG. 6 is a sectional diagram following FIG. 5 in the process of manufacturing the semiconductor device.

Next, as shown in FIG. 6, after the photoresist film PR1 is removed, for example, thermal oxidation or the like is performed to form an insulating film IF2 relatively small in thickness over the upper surface of the semiconductor substrate SB, which is exposed in the memory cell area 1A.

Figure 7:
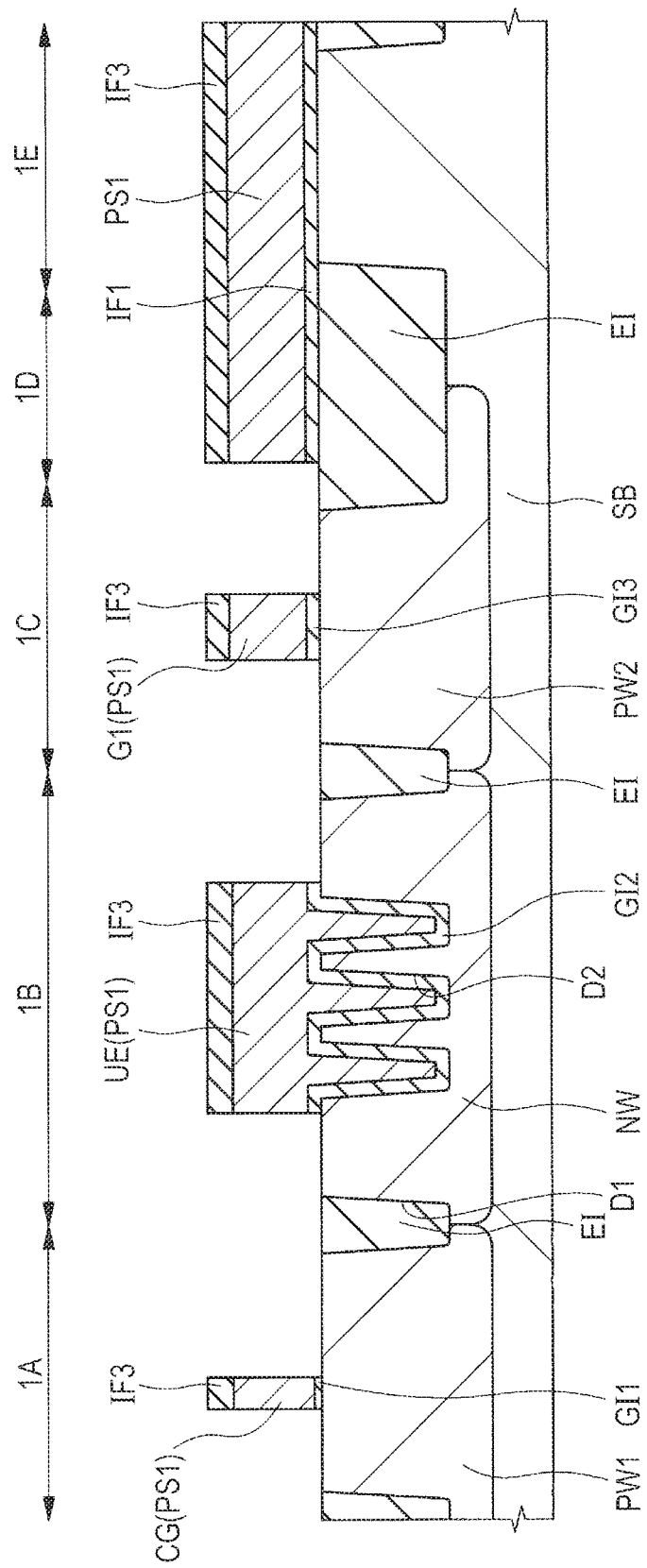
FIG. 7 is a sectional diagram following FIG. 6 in the process of manufacturing the semiconductor device.

Next, as shown in FIG. 7, a polysilicon film PS1 is formed over the whole main surface of the semiconductor substrate SB by using, for example, the CVD method. Thus, the upper surfaces of the insulating films IF1 and IF2 are covered by the polysilicon film PS1. At this time, since the thickness of the polysilicon film PS1 is sufficiently large with respect to the width of the trench D2 in its lateral direction (transverse direction), each trench D2 is completely embedded by the insulating film IF1 and the polysilicon film PS1, and the upper surface of the polysilicon film PS1 is almost non-recessed directly above the trench D2. That is, the trench D2 is completely embedded thereinside by the polysilicon film PS1 through the insulating film IF1.

Here, the polysilicon film PS1 with no impurity introduced therein is formed and thereafter an n-type impurity (e.g., P (phosphorus)) is implanted into the polysilicon film PS1 using the ion implantation method. Thus, the polysilicon film PS1 becomes an n-type semiconductor film. Thereafter, an insulating film IF3 included a silicon nitride film is formed over the polysilicon film PS1 using, for example, the CVD method. The polysilicon film PS1 can also be formed by forming it as an amorphous silicon film upon film deposition and thereafter polycrystallizing it by subsequent heat treatment.

Subsequently, the insulating film IF3 and the polysilicon film PS1 in each of the memory cell area 1A, the capacitive element area 1B, and the high breakdown voltage transistor area 1C are processed using the photolithography technique and the dry etching method. Also, thus, the insulating film IF2 in the memory cell area 1A is processed and the insulating film IF1 in each of the capacitive element area 1B and the high breakdown voltage transistor area 1C is processed.

Thus, in the memory area 1A, a control gate electrode CG included the polysilicon film PS1 is formed over the main surface of the semiconductor substrate SB through a gate insulating film GI1 included the insulating film IF2. Also, in the capacitive element area 1B, an upper electrode UE included the polysilicon film PS1 is formed over the main surface of the semiconductor substrate SB through a gate insulating film GI2 included the insulating film IF1. Further, in the high breakdown voltage transistor area 1C, a gate electrode G1 included the polysilicon film PS1 is formed through a gate insulating film GI3 included the insulating film IF1. Moreover, in the boundary area 1D, a laminated film included the insulating film IF1, the polysilicon film PS1, and the insulating film IF3 is terminated directly above the element isolation region EI. The laminated film is continuously formed between the low breakdown voltage transistor area 1E and the boundary area 1D. Further, the laminated film entirely covers the low breakdown voltage transistor area 1E.

Incidentally, in the present embodiment, the gate electrode G1 formed in the high breakdown voltage transistor area 1C is a pseudo gate electrode, i.e., a dummy gate electrode to be removed in a subsequent process.

Figure 8:
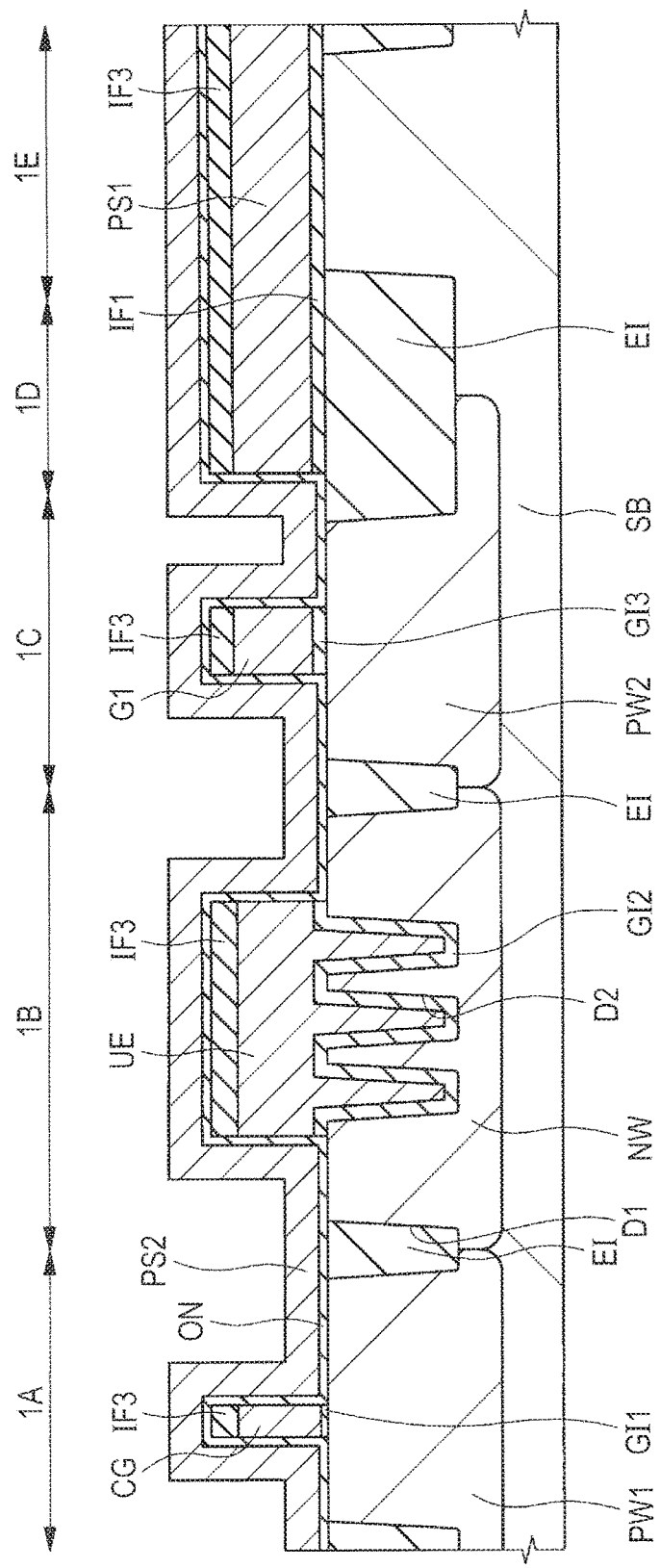
FIG. 8 is a sectional diagram following FIG. 7 in the process of manufacturing the semiconductor device.

Next, as shown in FIG. 8, an ONO (oxide-nitride-oxide) film ON being a laminated film for the gate insulating film of the memory transistor is formed over the whole main surface of the semiconductor substrate SB. The ONO film ON covers the upper surface of the semiconductor substrate SB in the memory cell area 1A, and the side walls and upper surface of the laminated film included the gate insulating film GI1, the control gate electrode CG, and the insulating film IF3. Further, the ONO film ON covers the capacitive element area 1B, the high breakdown voltage transistor area 1C, the boundary area D, and the low breakdown voltage transistor area 1E. Upon forming the ONO film ON, high heat is applied to the semiconductor substrate SB.

Here, in order to make the drawing easier to understand, the illustration of a laminated structure of the laminated film which configures the ONO film ON is omitted. That is, here, the boundary between the respective films which configure the ONO film ON is not illustrated. The ONO film ON is an insulating film having a charge storage part thereinside. Specifically, the ONO film ON is included a laminated film of a first silicon oxide film (bottom oxide film) formed over the semiconductor substrate SB, a silicon nitride film (charge storage part, charge storage film) formed over the first silicon oxide film, and a second silicon oxide film (top oxide film) formed over the silicon nitride film.

The first and second silicon oxide films can be formed by, for example, oxidation treatment (thermal oxidation treatment) or the CVD method, or a combination thereof. ISSG oxidation can also be used for the oxidation treatment at this time. The silicon nitride film can be formed by, for example, the CVD method. The thickness of each of the first and second silicon oxide films can be made to be about 2 to 10 nm, for example. The thickness of the silicon nitride film can be made to be 5 to 15 nm, for example.

Subsequently, a polysilicon film PS2 is formed over the whole main surface of the semiconductor substrate SB so as to cover the surface of the ONO film CN using, for example, the CVD method. Thus, the side walls and upper surface of the ONO film ON, which have been exposed in the memory cell area 1A are covered by the polysilicon film PS2. That is, the polysilicon film PS2 is formed over the side walls of the control gate electrode CG through the ONO film ON interposed therebetween.

The polysilicon film PS2 can also be formed by forming it as an amorphous silicon film upon film deposition and thereafter polycrystallizing it by subsequent heat treatment. The polysilicon film PS2 is a film in which, for example, an n-type impurity (e.g., phosphorus (P)) is introduced at a relatively high concentration.

Figure 9:
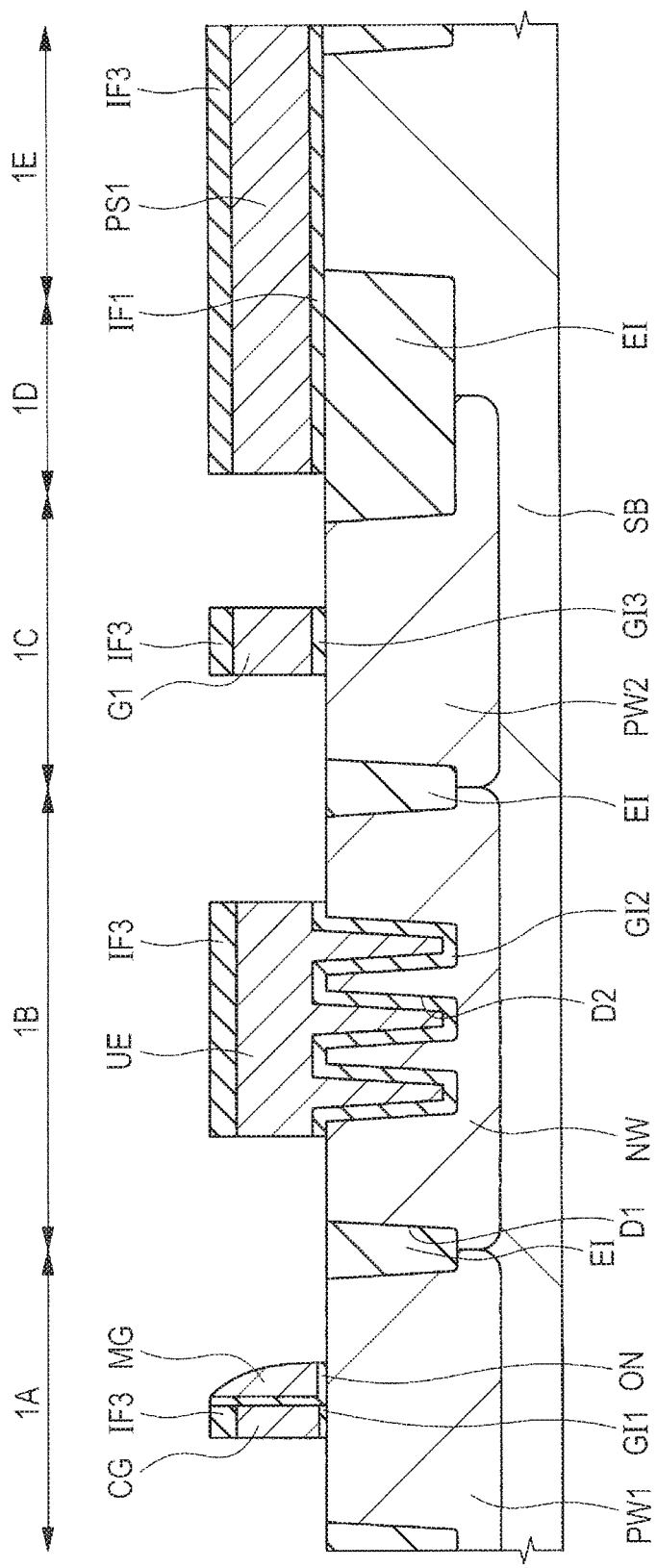
FIG. 9 is a sectional diagram following FIG. 8 in the process of manufacturing the semiconductor device.

Next, as shown in FIG. 9, the polysilicon film PS2 is etched back by the dry etching method to expose the upper surface of the ONO film ON. In the corresponding etchback process, the polysilicon film PS2 is anisotropically etched to thereby leave the sidewall-like polysilicon film PS2 so as to adjoin both side walls of the laminated film included the gate insulating film GI1, the control gate electrode CG, and the insulating film IF3 through the ONO film ON.

Thus, in the memory cell area 1A, a memory gate electrode MG included the polysilicon film PS2 left in the sidewall form through the ONO film ON is formed over one of the side walls of the laminated film. The upper surface of the ONO film ON in each of the capacitive element area 1B, the high breakdown transistor area 1C, the boundary area 1D, and the low breakdown voltage transistor area 1E is exposed by the above etchback.

Subsequently, a photoresist pattern (not shown) which covers the memory gate electrode MG adjacent to one side wall of the control gate electrode COG and exposes the polysilicon film PS2 adjacent to the other side wall of the control gate electrode CG is formed over the semiconductor substrate SB by using the photolithography technique. Thereafter, etching is performed with the photoresist pattern as an etching mask to thereby remove the polysilicon film PS2 formed on the opposite side of the memory gate electrode MG with the control gate electrode CG interposed therebetween. Afterwards, the photoresist pattern is removed. At this time, since the memory gate electrode MG is covered with the photoresist pattern, it remains without being subjected to etching.

Subsequently, a portion of the ONO film ON, which is exposed without being covered by the memory gate electrode MG is removed by etching (e.g., wet etching). At this time, the ONO film ON located directly below the memory gate electrode MG is left without being removed in the memory cell area 1A. Similarly, the ONO film ON positioned between the laminated film including the gate insulating film GI1, the control gate electrode CG, and the insulating film IF3 and the memory gate electrode MG is left without being removed. That is, the ONO film ON continuously formed from a region between the memory gate electrode MG and the main surface of the semiconductor substrate SB to a region between the laminated film and the memory gate electrode MG has an L-shaped sectional form.

Since the ONO film ON in other areas is removed, the upper surface of the semiconductor substrate SB in the memory cell area 1A is exposed, and the upper surface and side walls of the insulating film IF3 in each of the memory cell area 1A, the capacitive element area 1B, the high breakdown voltage transistor area 1C, the boundary area 1D, and the low breakdown voltage transistor area 1E are exposed. Further, the side wall which is the side wall of the control gate electrode CG and does not adjoin the memory gate electrode MG, the side walls of the upper electrode UE, the side walls of the gate electrode G1, and the side walls of the polysilicon film PS1 are exposed. Thus, the memory gate electrode MG is formed over the semiconductor substrate SB at a position adjacent to the control gate electrode CG through the ONO film ON having the charge storage part thereinside.

Figure 10:
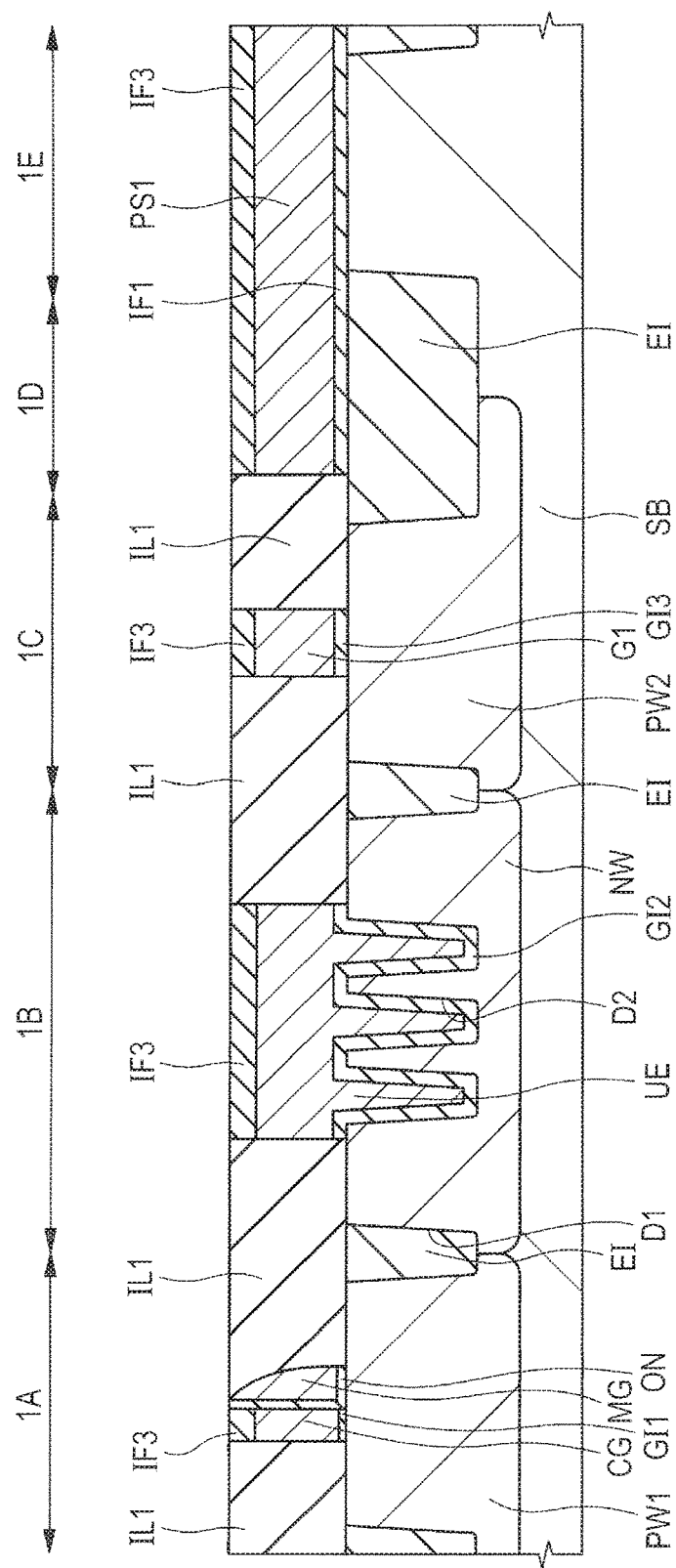
FIG. 10 is a sectional diagram following FIG. 9 in the process of manufacturing the semiconductor device.

Next, as shown in FIG. 10, an interlayer insulating film IL1 is formed over the main surface of the semiconductor substrate SB using, for example, the CVD method. The interlayer insulating film IL1 is included, for example, a silicon oxide film, but may be a film included polysilicon. The thickness of the interlayer insulating film IL1 is larger than the thickness of the laminated film included the gate insulating film GI2, the gate electrode G1, and the insulating film IF3. Subsequently, the upper surface of the interlayer insulating film IL1 is polished by, for example, a CMP method to expose the upper surface of the insulating film IF3. After the corresponding polishing process, the interlayer insulating film IL1 covers the respective side walls of patterns of the control gate electrode CG, the upper electrode UE, and the gate electrode G1, etc.

Figure 11:
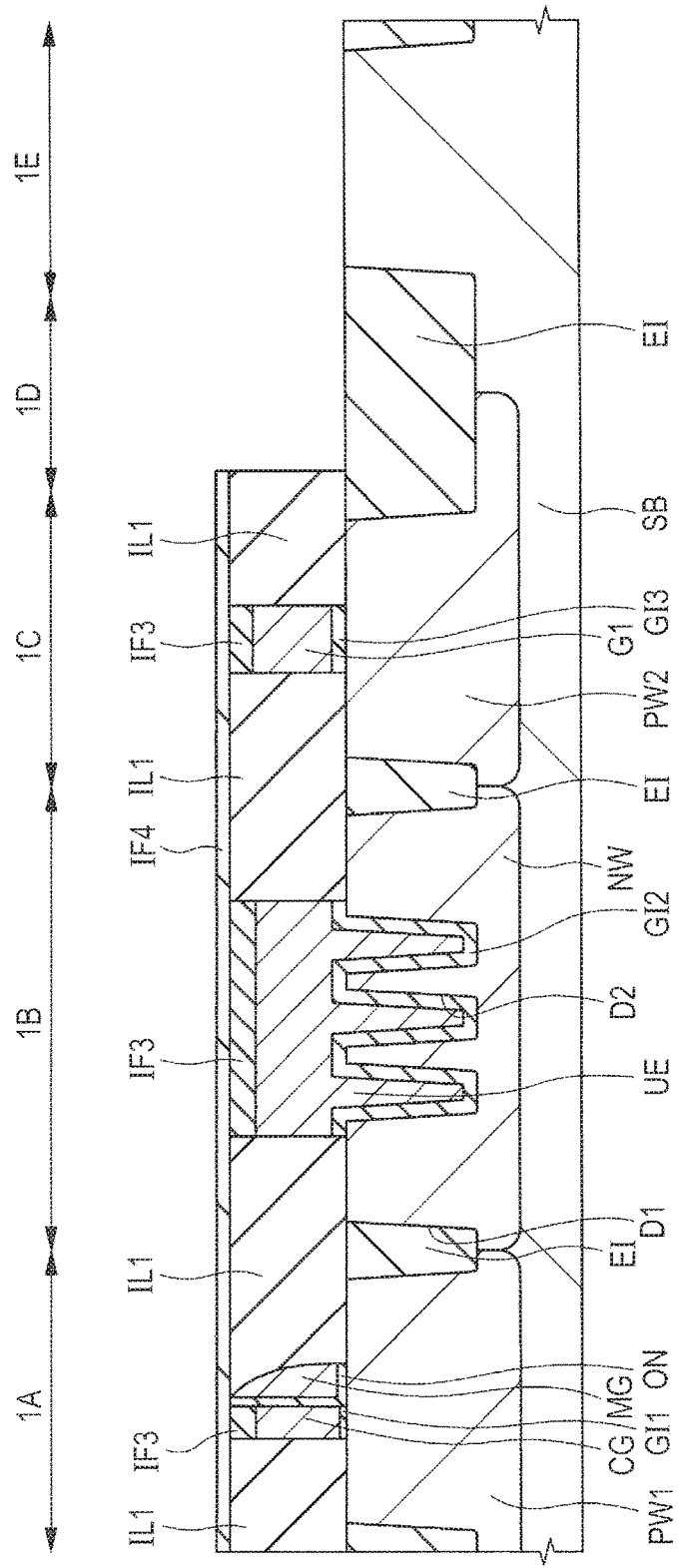
FIG. 11 is a sectional diagram following FIG. 10 in the process of manufacturing the semiconductor device.

Next, as shown in FIG. 11, after an insulating film (protection film) IF4 is formed over the interlayer insulating film IL1 and the insulating film IF3, the insulating film IF4 is processed using the photolithography technique and the etching method. A pattern of the insulating film IF4 formed thereby covers the memory cell area 1A, the capacitive element area 1B, and the high breakdown voltage transistor area 1C and covers one part of the interlayer insulating film IL1 in the boundary area 1D. Further, the insulating film IF4 exposes the whole of the low breakdown voltage transistor area 1E and exposes the insulating film IF3 and the polysilicon film PS1 in the boundary area 1D. The insulating film IF4 is included, for example, a silicon oxide film.

Subsequently, the insulating film IF3, the polysilicon film PS1, and the insulating film IF1 in the boundary area 1D and the low breakdown voltage transistor area 1E are removed using the insulating film IF4 as a mask to thereby expose the upper surface of each element isolation region EI and the main surface of the semiconductor substrate SB.

Figure 12:
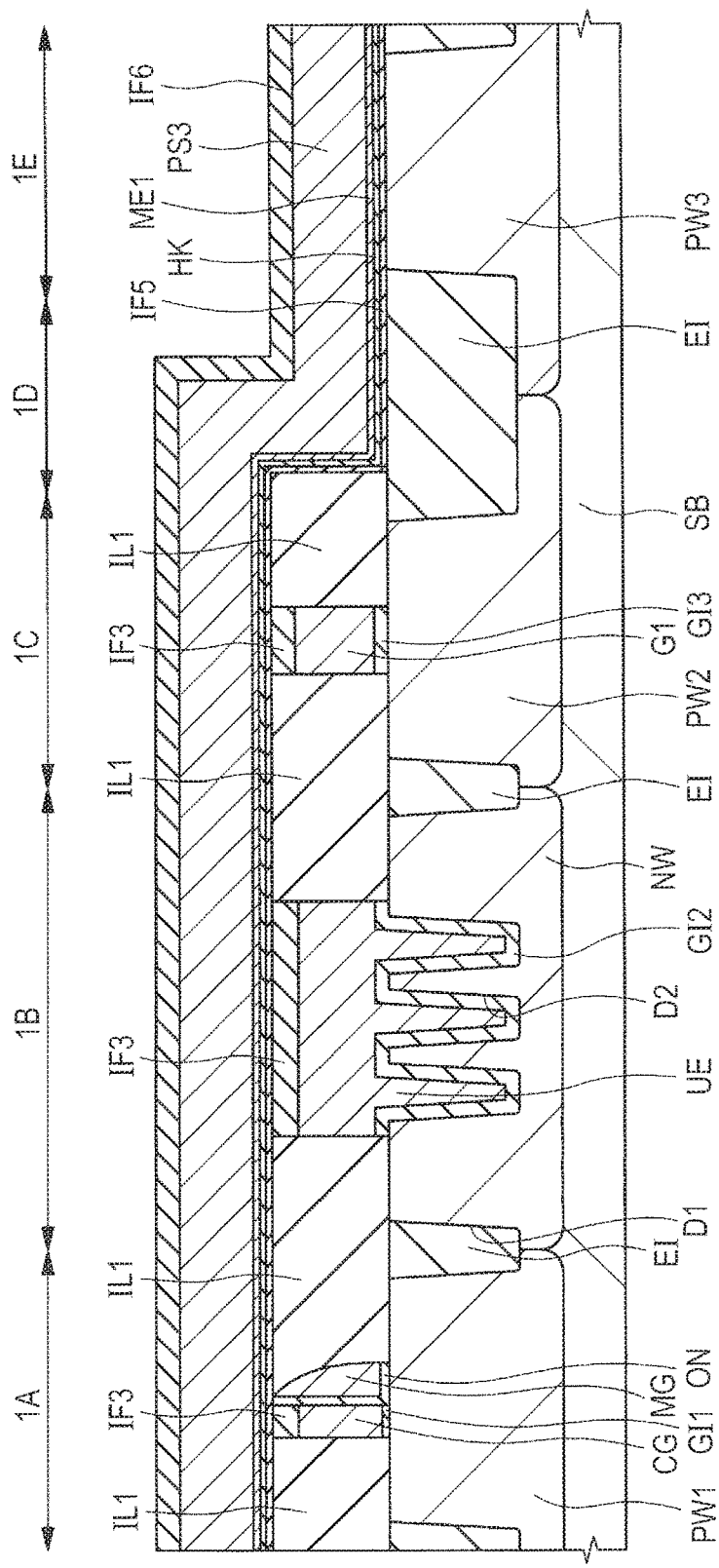
FIG. 12 is a sectional diagram following FIG. 11 in the process of manufacturing the semiconductor device.

Next, as shown in FIG. 12, after the insulating film IF4 is removed, a p-type impurity (e.g., B (boron)) is implanted into the main surface of the semiconductor substrate SB in the low breakdown voltage transistor area 1E using the photolithography technique and the ion implantation method to thereby form a p-type well PW3. The well PW3 is formed so as to reach the inside of the semiconductor substrate SB in the boundary area 1D. Thus, the purpose of forming the well PW3 after the wells PW1 and PW2 is to prevent the p-type well in the low breakdown voltage transistor area 1E from being affected by heat generated upon deposition of the ONO film ON in the memory cell area 1A.

Subsequently, an insulating film IF5 is formed over the semiconductor substrate SB. The insulting film IF5 is included, for example, a silicon oxide film or a silicon oxynitride film and can be formed by, for example, a thermal oxidation method or the like. When the insulating film IF5 is assumed to be the silicon oxynitride film, the insulating film IF5 can be formed by, for example, a high temperature short-time oxidation method using $N_2O$, $O_2$ and $H_2$ or a method of performing nitriding treatment (plasma nitriding) in plasma after the formation of a silicon oxide film, or the like. The physical thickness of the insulating film IF5 can be made to be thinner than that of an insulating film HK to be described below, preferably 0.5 to 2 nm, for example, about 1 nm.

The insulating film IF5 can be formed using, for example, the thermal oxidation method or the like. That is, the insulating film IF5 is formed so as to cover the main surface of the semiconductor substrate SB, which is exposed in the low breakdown voltage transistor area 1E. Incidentally, when the insulating film IF5 is formed by the oxidation method, there is considered a case where the insulating film IF5 is not formed over the surfaces of the element isolation region EI, the insulating film IF3 and the interlayer insulating film IL1. A description will however be made about a case where the insulating film IF5 is formed so as to cover the entire main surface of the semiconductor substrate SB.

Subsequently, the insulating film HK and a metal film ME1 are formed in order over the semiconductor substrate SB, i.e., the insulating film IF5. Then, a polysilicon film PS3 and an insulating film IF6 are formed in order over the semiconductor substrate SB, i.e., the metal film ME1. That is, here, the insulating film IF5, the insulating film HK, the metal film ME1, the polysilicon film PS3, and the insulating film IF6 are formed in order over the semiconductor substrate SB. Thus, a laminated film of the insulating film IF5, the insulating film HK, the metal film ME1, the polysilicon film PS3, and the insulating film IF6 is formed over the semiconductor substrate SB.

The insulating film IF5 and the insulating film HK are respectively an insulating film which will serve as a gate insulating film later. The metal film ME1 and the polysilicon film PS3 are respectively a conductor film to be a gate electrode later. However, the polysilicon film PS3 is a film used to form a pseudo gate electrode, i.e., a dummy gate electrode to be removed in a subsequent process. Specifically, the insulating film IF5 and the insulating film HK are respectively an insulating film for a gate insulating film of a MISFET formed in the low breakdown voltage transistor area 1E. The metal film ME1 is a conductor film for the gate electrode of the MISFET formed in the low breakdown voltage transistor area 1E. Since the insulating film IF5 is formed between the insulating film HK and the semiconductor substrate SB, it can also be assumed to be a boundary layer.

The insulating film HK is an insulation material film higher in dielectric constant (specific dielectric constant) than silicon nitride, a so-called high-k film (high dielectric constant film). Incidentally, the high-k film, high dielectric constant film or high dielectric constant gate insulating film mentioned in the present application means a film higher in dielectric constant (specific dielectric constant) than silicon nitride.

A metal oxide film such as a hafnium oxide film, a zirconium oxide film, an aluminum oxide film, a tantalum oxide film or a lanthanum oxide film can be used as the insulating film HK. Also, these metal oxide films can also further contain one or both of nitrogen (N) and silicon (Si). The insulating film HK can be formed by, for example, an ALD (Atomic Layer Deposition) method or a CVD method. When the high dielectric constant film (insulating film HK herein) is used for the gate insulating film, the physical film thickness of the gate insulating film can be increased as compared with, for example, a case where only a silicon oxide film is used for the gate insulating film. It is therefore possible to obtain an advantage that a leakage current can be reduced in a MISFET to be formed later.

Further, the process of forming the insulating film IF5 is omitted and the insulating film HK being the high dielectric constant film can also be formed directly over the upper surface (silicon surface) of the semiconductor substrate SB in the low breakdown voltage transistor area 1E. However, an insulating film (boundary layer) IF5 included a thin silicon oxide film or silicon oxynitride film may more preferably be provided at the interface between the insulating film HK and the semiconductor substrate SB in the low breakdown voltage transistor area 1E without omitting the process of forming the insulating film IF5. That is, more preferably, the insulating film IF5 is formed and the insulating film HK is formed. Thus, in the MISFET formed in the low breakdown voltage transistor area E later, the interface between the gate insulating film and the semiconductor substrate (its silicon surface) is brought into an $SiO_2/Si$ (SiON/Si) structure, and the number of defects such as trap levels is reduced, thereby making it possible to improve drive capability and reliability.

As the metal film ME1, there can be used, for example, a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a nitrided carbide tantalum (TaCN) film, a titanium (Ti) film, a tantalum (Ta) film or a titanium aluminum (TiAl) film. Incidentally, the metal film mentioned herein indicates a conductor film indicative of metal conduction and includes not only a single metal film (pure metal film) and an alloy film but also a metal compound film (metal nitride film or metal carbide film or the like) indicative of metal conduction. The metal film ME1 can be formed using, for example, a sputtering method or the like.

Since the gate electrode (gate electrode of MISFET formed in the low breakdown voltage transistor area 1E) is formed later using the metal film ME1, the gate electrode can be made to be a metal gate electrode. There can be obtained an advantage that it is possible to suppress a depletion phenomenon of the gate electrode and eliminate a parasitic capacitance by configuring the gate electrode by the metal gate electrode. Further, miniaturization of the MISFET element (thinning of gate insulating film) is also possible.

The polysilicon film PS3 is included a polycrystalline silicon film (polysilicon film) and can be formed using the CVD method or the like. Upon its film deposition, after forming the polysilicon film PS3 as an amorphous silicon film, the amorphous silicon film can also be made to be a polycrystalline silicon film by subsequent heat treatment. Further, the polysilicon film PS3 can be made to be a low-resistance semiconductor film (doped polysilicon film) by introducing an impurity upon the film deposition or ion-implanting an impurity after the film deposition, etc.

Incidentally, since the polysilicon film PS3 in the memory cell area 1A is removed later, an impurity having a conductivity type as an n type or a p type may or may not be introduced in the polysilicon film PS3. Further, since the polysilicon film PS3 formed in the low breakdown voltage transistor area 1E is a film brought to a dummy gate electrode later, but the dummy gate electrode is a film to be removed later, the impurity may not be introduced in the polysilicon film PS3. The insulating film IF6 is included, for example, a silicon nitride film and can be formed using, for example, the CVD method.

Figure 13:
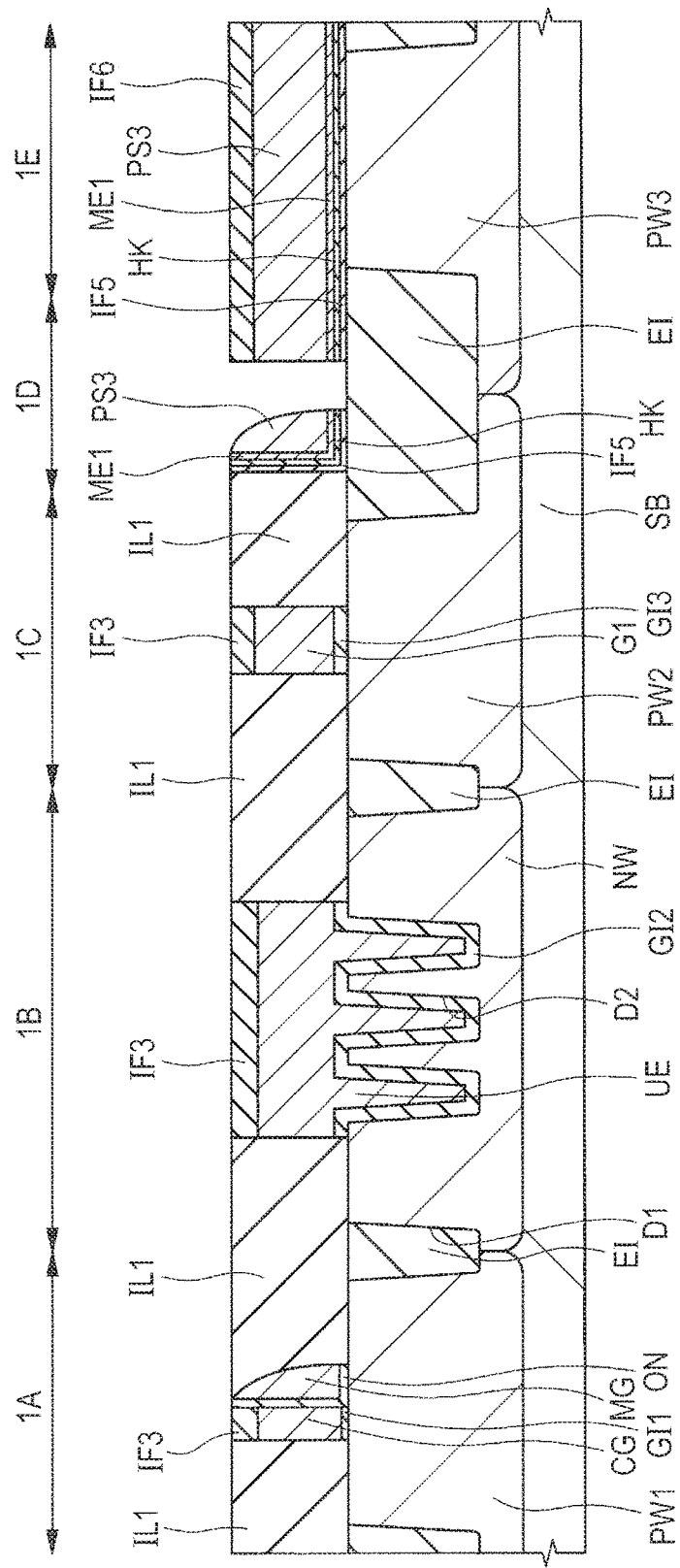
FIG. 13 is a sectional diagram following FIG. 12 in the process of manufacturing the semiconductor device.

Next, as shown in FIG. 13, the laminated film included the insulating film IF6, the polysilicon film PS3, the metal film ME1, and the insulating films HK and IF5 is patterned using the photolithography technique and the etching method. Thus, the upper surface of the interlayer insulating film IL1 and the upper surface of the insulating film IF3 are exposed in the memory cell area 1A, the capacitive element area 1B, and the high breakdown voltage transistor area 1C. Further, a part of the upper surface of the element isolation region EI is exposed in the boundary area 1D.

Here, in the low breakdown voltage transistor area 1E, the laminated film is left without patterning the same. Further, in the boundary area 1D, the laminated film which is a part of the laminated film and contacts the side wall of the interlayer insulating film IL1 is left in a sidewall form. The sidewall-like laminated film is hereinafter called a first pattern. Also, in the boundary area 1D, a part of the laminated film, which is continuously formed from the low breakdown voltage transistor area 1E is left over the element isolation region EI. That is, in the boundary area 1D, the laminated film (first pattern) left in the sidewall form and the laminated film continuously formed from the low breakdown voltage transistor area 1E are formed separately from each other.

Figure 14:
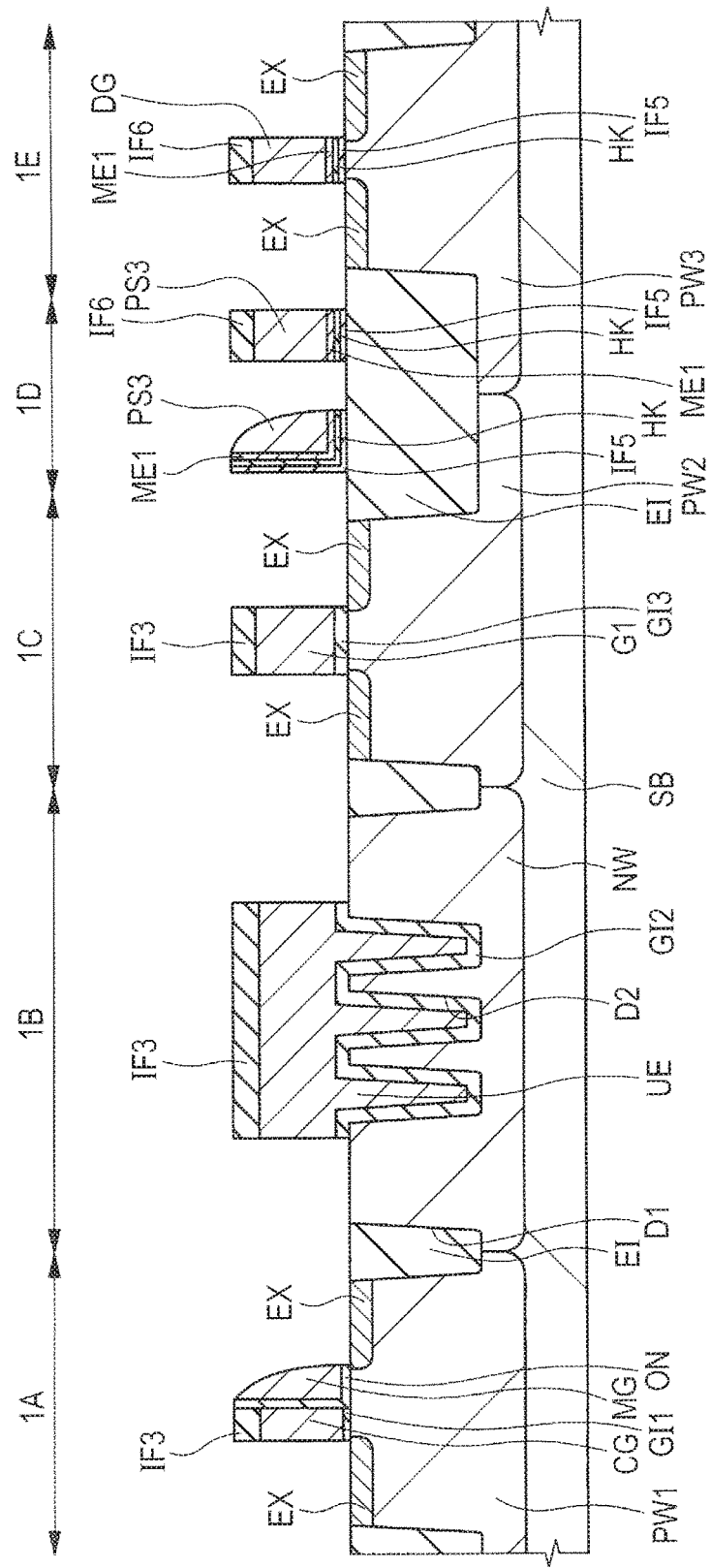
FIG. 14 is a sectional diagram following FIG. 13 in the process of manufacturing the semiconductor device.

Next, as shown in FIG. 14, the laminated film included the insulating film IF6, the polysilicon film PS3, the metal film ME1, and the insulating films HK and IF5 in the boundary area 1D and the low breakdown voltage transistor area 1E is patterned using the photolithography technique and the etching method. Consequently, a gate insulting film included the insulating films IF5 and HK is formed over the main surface of the semiconductor substrate SB in the low breakdown voltage transistor area 1E, and a dummy gate electrode DG included the polysilicon film PS3 is formed over the gate insulating film through the metal film ME1 interposed therebetween. The dummy gate electrode DG is a pseudo gate electrode to be removed in a subsequent process.

Further, a part (hereinafter called a second pattern) of the laminated film including the polysilicon film PS3 separated from the polysilicon film PS3 which configures the dummy gate electrode DG is left over the element isolation area EI in the boundary area 1D by the above patterning process.

Subsequently, the interlayer insulating film IL1 in each of the memory cell area 1A, the capacitive element area 1B, the high breakdown voltage transistor area 1C, and the boundary area 1D is removed by etching. Thereafter, an n-type impurity (e.g., As (arsenic) or P (phosphorus)) is implanted into the main surface of the semiconductor substrate SB in each of the memory cell area 1A, the high breakdown voltage transistor area 1C, and the low breakdown voltage transistor area 1E using the ion implantation method to thereby form extension regions EX each of which is an $n^-$ type semiconductor region.

In the memory area 1A, a pair of the extension regions EX is formed in the main surface of the semiconductor substrate SB so as to interpose the pattern including the control gate electrode CG and the memory gate electrode MG therebetween. In the high breakdown voltage transistor area 1C, a pair of the extension regions EX is formed in the main surface of the semiconductor substrate SB so as to interpose the gate electrode G1 therebetween. In the low breakdown voltage transistor area 1E, a pair of the extension regions EX is formed in the main surface of the semiconductor substrate SB so as to interpose the dummy gate electrode DG therebetween.

Incidentally, an ion implantation process is performed a plurality of times using the photolithography technique without forming the extension regions EX in each area by single ion implantation, and thereby ion implantation may be performed on the memory cell area 1A, the high breakdown voltage transistor area 1C, and the low breakdown voltage transistor area 1E under different implantation conditions, respectively. That is, various extension regions EX having separate concentrations and depths to be formed may be formed according to the characteristics of the elements formed in the respective areas.

In addition to the above, a p-type impurity (e.g., B (boron)) may be implanted into the main surface of the semiconductor substrate SB to form a Halo region which is a p-type semiconductor region. Also, the process of implanting carbon (C) or the like into the main surface of the semiconductor substrate SB, i.e., a co-impla process may be performed with the aim of suppressing an impurity diffusion. Further, although no extension regions EX are formed in the capacitive element area 1B herein, an n-type impurity may be implanted into the main surface of the semiconductor substrate SB in the capacitive element area 1B in the process of forming the extension regions EX. In the present embodiment, since the n-type well NW is formed in advance, there is no need to implant the n-type impurity into the capacitive element area 1B.

Figure 15:
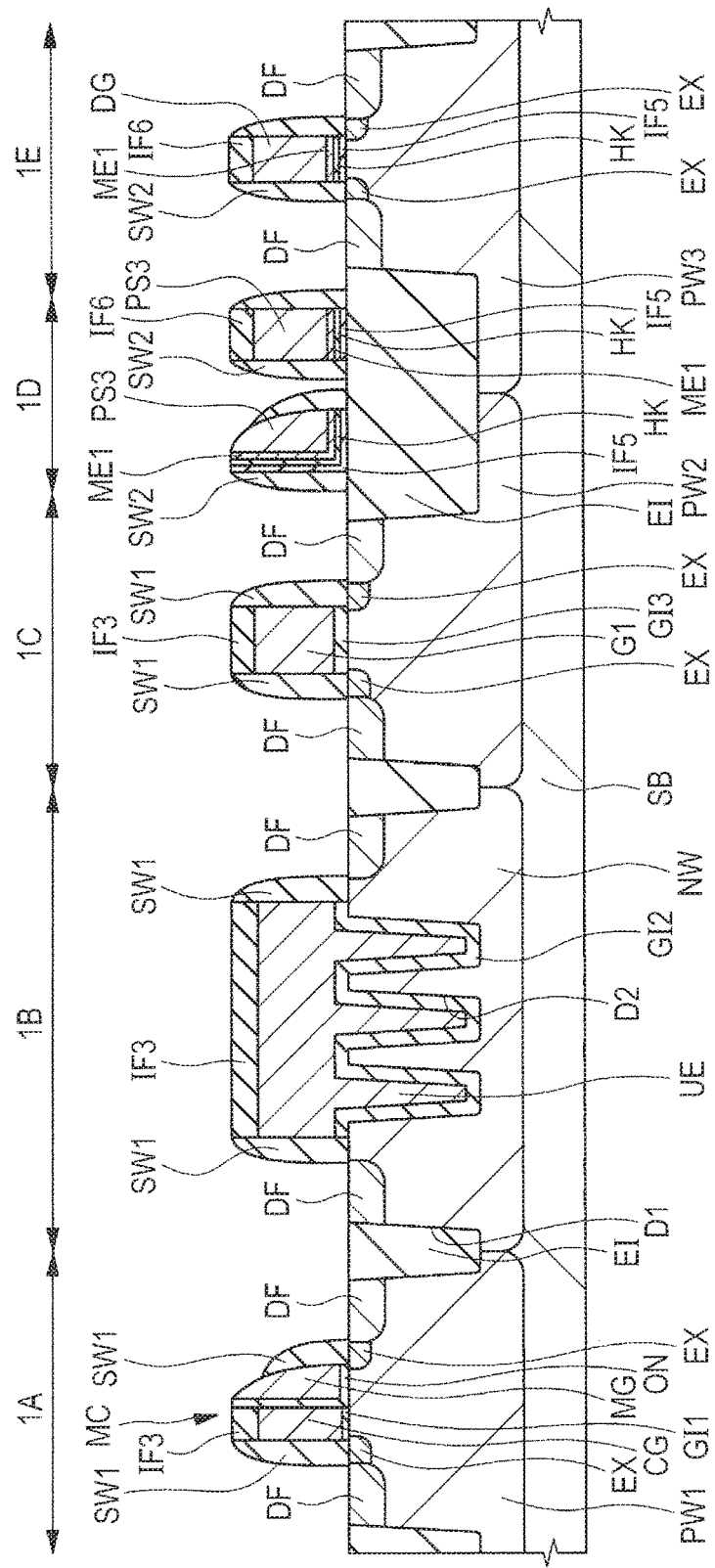
FIG. 15 is a sectional diagram following FIG. 14 in the process of manufacturing the semiconductor device.

Next, as shown in FIG. 15, side walls SW1 which cover the side walls on both sides of the pattern including the control gate electrode CG, the memory gate electrode MG, the gate insulating film GI1, the insulating film IF3, and the ONO film CN are formed in the memory cell area 1A. Also, according to the same process, side walls SW1 which cover the side walls on both sides of the laminated film included the gate insulating film GI2, the upper electrode UE, and the insulating film IF3 are formed in the capacitive element area 1B. Further, according to the same process, side walls SW1 which cover the side walls on both sides of the laminated film including the gate insulating film GI3, the gate electrode G1, and the insulating film IF3 are formed in the high breakdown voltage transistor area 1C.

Also, here, side walls SW2 which cover the side walls on both sides of the laminated film including the insulating films IF5 and HK, the metal film ME1, the dummy gate electrode DG, and the insulating film IF6 are formed in the low breakdown voltage transistor area 1E. Further, in the same process, side walls SW2 are formed which cover the respective side walls of the two laminated films (first and second patterns) each including the insulating films IF5 and HK, the metal film ME1, the polysilicon film PS3, and the insulating film IF6 formed in the boundary area 1D. Each side wall SW2 is included the insulting film small in width in the direction along the main surface of the semiconductor substrate SB as compared with the side walls SW1.

Thus, the two types of side walls SW1 and SW2 having the different widths are formed herein. The side walls SW1 and SW2 can be formed in a self-aligning manner by, for example, sequentially forming a silicon oxide film and a silicon nitride film over the semiconductor substrate SB using the CVD method, and thereafter removing parts of the silicon oxide film and the silicon nitride film by anisotropic etching to thereby expose the upper surface of the semiconductor substrate SB and the upper surfaces of the insulating films IF3 and IF6. That is, it is considered that the side walls SW1 and SW2 are formed by the laminated films. A description about a method of forming the two types of side walls SW1 and SW2 with widths different from each other will be omitted here. Incidentally, the side walls SW2 small in width may be formed so as to adjoin the side walls of the upper electrode UE without forming the side walls SW1 in the capacitive element area 1B.

Subsequently, diffusion layers DF which are a plurality of $n^+$ type semiconductor regions (impurity diffusion regions) are formed in the memory cell area 1A, the capacitive element area 1B, the high breakdown voltage transistor area 1C, and the low breakdown voltage transistor area 1E by using the ion implantation method or the like. That is, here, an n-type impurity (e.g., arsenic (As) or phosphorus (P)) is introduced into the main surface of the semiconductor substrate SB by the ion implantation method using the insulating films IF3 and IF5, the control gate electrode CG, the memory gate electrode MG, the dummy gate electrode DG, the ONO film ON, the upper electrode UE, the gate electrode G1, the dummy gate electrode DG, and the side walls SW1 and SW2 as masks. Thus, the diffusion layers DF being the $n^+$ type semiconductor regions can be formed in a plural manner. Each diffusion layer DF is higher in impurity concentration than the extension region EX and deep in terms of a junction depth (formed depth). Incidentally, the diffusion layer DF may be formed at a junction depth shallower than the extension region EX.

Thus, source/drain regions each included the extension region EX being the n⁻ type semiconductor region and the diffusion layer DF being the n⁺ type semiconductor region higher in impurity concentration than the extension region EX and having an LDD (Lightly Doped Drain) structure are formed in the memory cell area 1A, the high breakdown voltage transistor area 1C, and the low breakdown voltage transistor area 1E.

The source/drain region including the extension region EX and the diffusion layer DF formed in the memory cell area 1A, and the control gate electrode CG configure a control transistor. Further, the source/drain region formed in the memory cell area 1A, and the memory gate electrode MG configure a memory transistor. That is, the control transistor and the memory transistor share the source/drain regions with each other. The control transistor and the memory transistor sharing the source/drain regions configure one memory cell MC.

Although the diffusion layers DF in the respective areas can also be formed through one ion implantation process, the diffusion layers DF may be formed through different ion implantation processes and formed at separate impurity concentrations or depths. Further, of the pair of diffusion layers DF formed in the memory cell area 1A, the diffusion layer DF formed on the memory gate electrode MG side and the diffusion layer DF formed on the control gate electrode CG side may be respectively formed by separate ion implantation processes and formed at separate impurity concentrations or separate depths.

Further, in the capacitive element area 1B, diffusion layers DF are formed in the main surface of the semiconductor substrate SB, which is exposed laterally of the upper electrode UE from the element isolation regions EI. The corresponding diffusion layers DF are used as regions for coupling to contact plugs each used to apply a voltage to the semiconductor substrate SB (well NW) which is a lower electrode of a capacitive element to be formed later.

Subsequently, activation annealing as heat treatment for activating the impurity introduced into the semiconductor regions (extension region EX and diffusion layer DF) and the like for the source/drain regions is performed.

Figure 16:
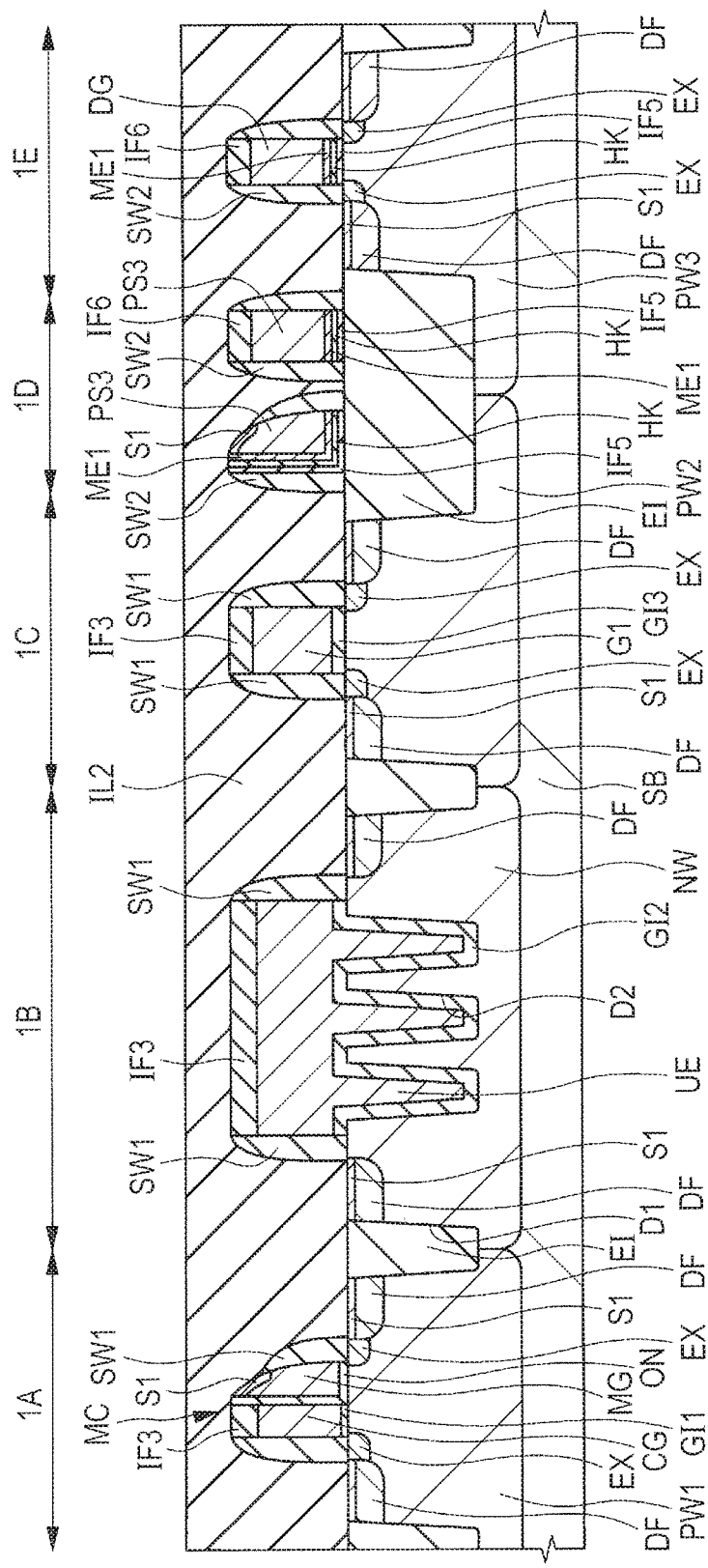
FIG. 16 is a sectional diagram following FIG. 15 in the process of manufacturing the semiconductor device.

Next, as shown in FIG. 16, a silicide layer S1 is formed. The silicide layer S1 can be formed by performing a so-called salicide (Self Aligned Silicide) process. Specifically, the silicide layer S1 can be formed in the following manner.

That is, first, a metal film for the formation of the silicide layer S1 is formed (deposited) over the entire main surface of the semiconductor substrate SB including over the upper surface of each diffusion layer DF and the upper surface of the memory gate electrode MG. The corresponding metal film, a single metal film (pure metal film) or an alloy film can be used therefor. The silicide layer S1 is formed with, for example, a cobalt (Co) film, a nickel (Ni) film or a nickel-platinum alloy film and can be formed using the sputtering method or the like.

Then, heat treatment (heat treatment for the formation of the silicide layer S1) is performed on the semiconductor substrate SB to cause the exposed portions defining the respective surface layer portions of the diffusion layers DF, the memory gate electrode MG, and the polysilicon films PS3 to react with the corresponding metal film. Consequently, the silicide layer S1 is formed above each of the diffusion layers DF, the memory gate electrode MG, and the polysilicon film PS3 configuring the first pattern. Thereafter, the metal film which is unreacted is removed by wet etching or the like. Since the sidewall-like upper portion of the memory gate electrode MG is exposed, the silicide layer S1 is formed at its exposed portion. The corresponding silicide layer S1 over the memory gate electrode MG is completely removed by a polishing process based on a CMP method, which is performed in a subsequent process.

The silicide layer S1 can be made to be, for example, a cobalt silicide layer, a nickel silicide layer, or a nickel platinum silicide layer. Incidentally, the upper surfaces of the control gate electrode CG, the upper electrode UE, and the gate electrode G1 are respectively covered by the insulating film IF3 which is a cap film. Further, the upper surfaces of the dummy gate electrode DG and the polysilicon film PS3 which configures the second pattern in the boundary area 1D are respectively covered by the insulating film IF6 which is a cap film. Therefore, no silicide layer S1 is formed above the respective upper surfaces of the control gate electrode CG, the upper electrode UE, the gate electrode G1, the dummy gate electrode DG, and the polysilicon film PS3.

Subsequently, an interlayer insulating film IL2 is formed over the entire main surface of the semiconductor substrate SB so as to cover the control gate electrode CG, the memory gate electrode MG, the side walls SW1 and SW2, the upper electrode UE, the gate electrode G1, and the dummy gate electrode DG. The interlayer insulating film IL2 is included, for example, a single film which is a silicon oxide film and can be formed by, for example, the CVD method or the like. Here, for example, the interlayer insulating film IL2 is formed at a thickness thicker than the thickness of the laminated film included the gate insulating film GI1, the control gate electrode CG, and the insulating film IF3.

Figure 17:
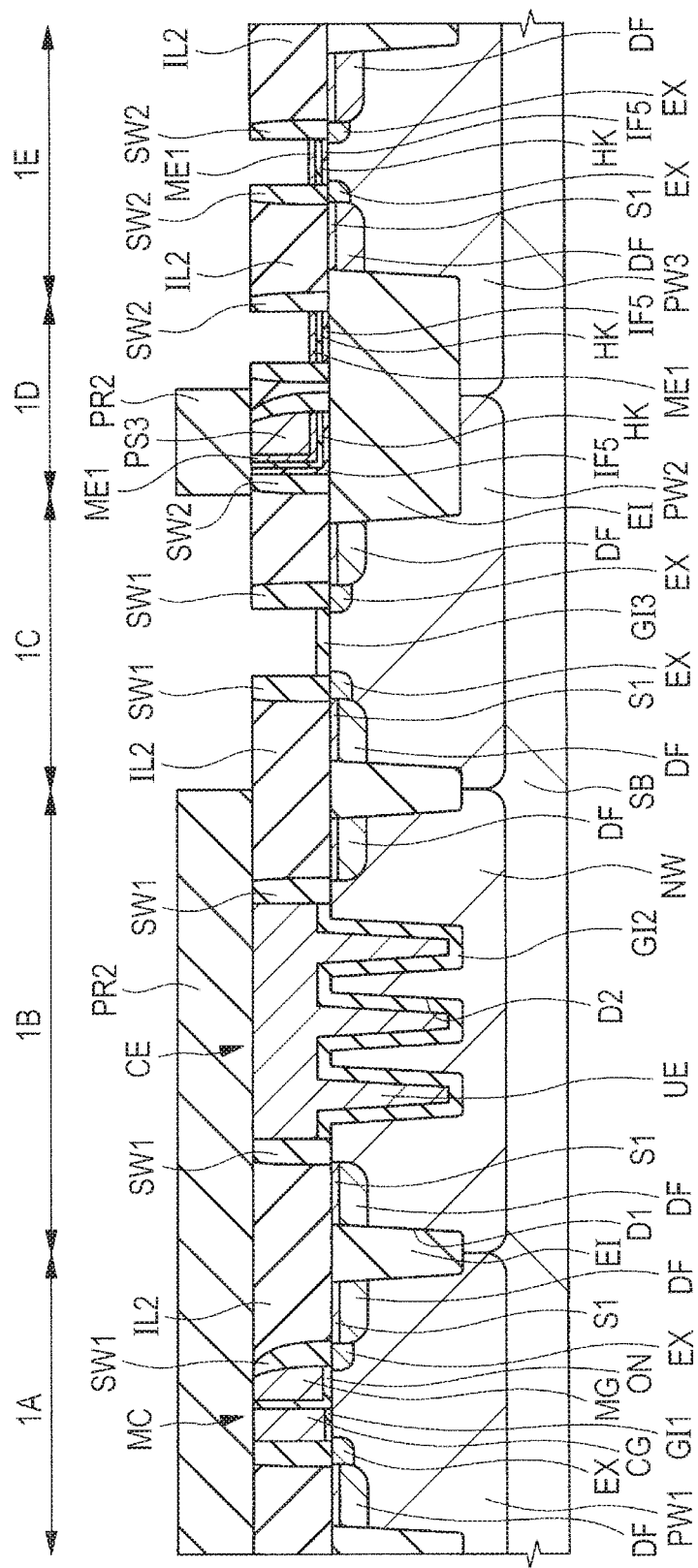
FIG. 17 is a sectional diagram following FIG. 16 in the process of manufacturing the semiconductor device.

Next, as shown in FIG. 17, the upper surface of the interlayer insulating film IL2 is polished using the CMP method or the like. Thus, the respective upper surfaces of the control gate electrode CG, the memory gate electrode MG, the upper electrode UE, the gate electrode G1, the polysilicon film PS3, and the dummy gate electrode DG are respectively exposed. That is, in this polishing process, the interlayer insulating film IL2 is polished until the respective upper surfaces of the control gate electrode CG, the memory gate electrode MG, the upper electrode UE, the gate electrode G1, the polysilicon film PS3, and the dummy gate electrode DG are exposed. Thus, the insulating films IF3 and IF6 are removed and the upper portions of the respective side walls SW1 and SW2 are also partly removed.

By this process, the silicide layer S1 lying over the memory gate electrode MG is removed together with a portion of the upper part of the memory gate electrode MG. Similarly, the silicide layer S1 lying over the polysilicon film PS3 in the boundary area 1D is removed together with a portion of the upper part of the polysilicon film PS3.

Further, by the above polishing process, the upper surface of the upper electrode UE in the capacitive element area 1B is retreated to thereby form the capacitive element CE including the upper electrode UE, the lower electrode included the semiconductor substrate SB directly below the upper electrode UE, and the gate insulating film GI2 between the upper electrode UE and the semiconductor substrate SB. The gate insulating film GI2 is interposed between the upper electrode UE and the semiconductor substrate SB. Thus, the upper electrode UE and the lower electrode are separated from each other by the gate insulating film GI2 and insulated from each other.

Subsequently, a photoresist film PR2 is formed over the interlayer insulating film IL1. The photoresist film PR2 is a resist pattern which exposes the high breakdown voltage transistor area 1C and the low breakdown voltage transistor area 1E, and a part of the boundary area 1D and covers the memory cell area 1A, the capacitive element area 1B, and a part of the boundary area 1D. In the boundary area 1D, the photoresist film PR2 exposes the second pattern and covers the first pattern.

Following the above, etching is performed using the photoresist film PR2 as a mask to thereby remove the gate electrode G1 being the dummy gate electrode, the polysilicon film PS3 which configures the second pattern, and the dummy gate electrode DG. Here, wet etching is performed by, for example, an alkaline aqueous solution to remove the gate electrode G1, the polysilicon film PS3, and the dummy gate electrode DG. With the removal of the gate electrode G1, the polysilicon film PS3, and the dummy gate electrode DG, a first trench (concave portion, recessed portion) defined over the gate insulating film GI3 in the high breakdown voltage transistor area 1C, a second trench at the position where the polysilicon film PS3 configuring the second pattern in the boundary area 1D is formed, and a third trench defined over the metal film ME1 in the low breakdown voltage transistor area 1E are formed.

The first trench is a region from which the gate electrode G1 is removed. Side walls on both sides of the first trench are configured by the side walls SW1, and the bottom face of the first trench is configured by the upper surface of the gate insulating film GI3. The second trench is a region from which the polysilicon film PS3 which configures the second pattern is removed. Side walls on both sides of the second trench are configured by the side walls SW2. The bottom face of the second trench is configured by the upper surface of the metal film ME1. The third trench is a region from which the dummy gate electrode DG is removed. Side walls on both sides of the third trench are configured by the side walls SW2, and the bottom face of the third trench is configured by the upper surface of the metal film ME1.

Figure 18:
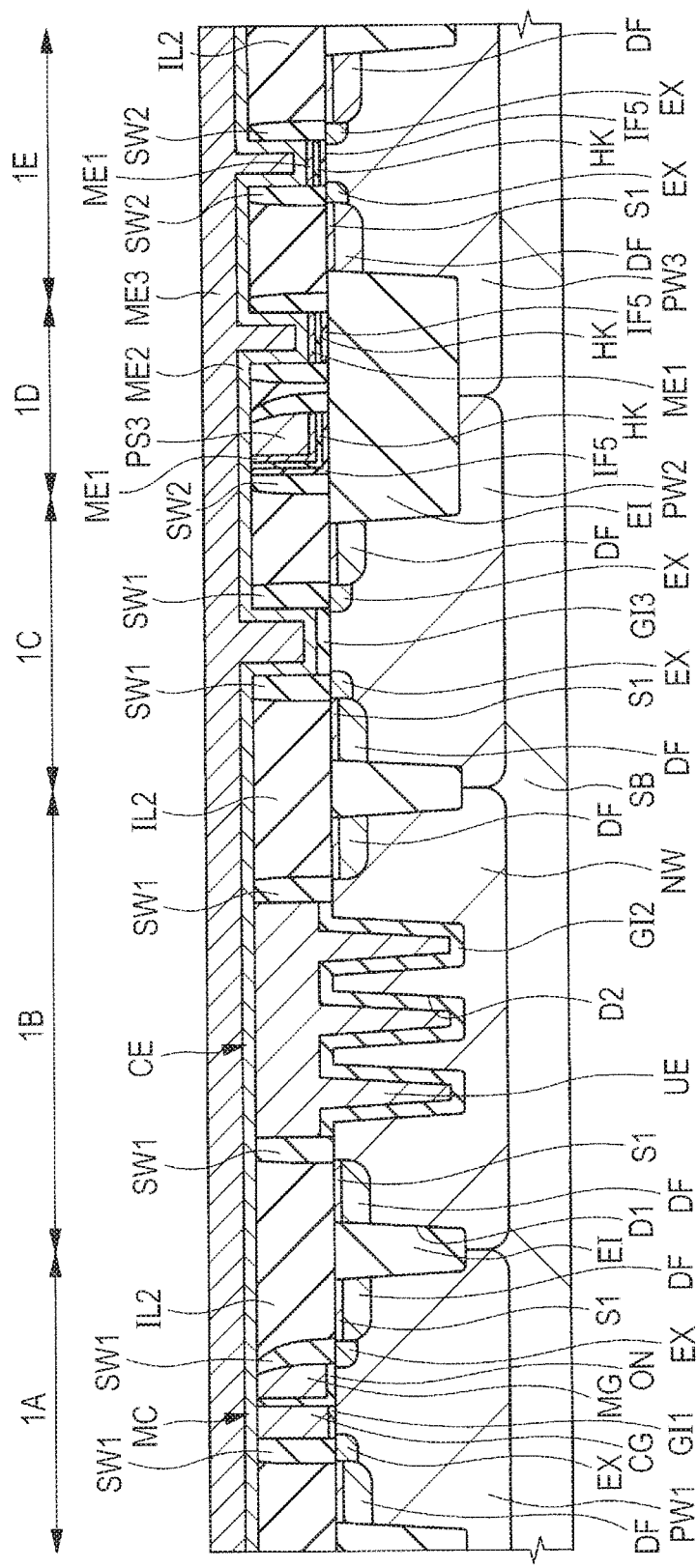
FIG. 18 is a sectional diagram following FIG. 17 in the process of manufacturing the semiconductor device.

Next, as shown in FIG. 18, after removal of the photoresist film PR2, metal films ME2 and ME3 are sequentially formed as conductor films for gate electrodes over the interlayer insulating film IL2 including over the bottom faces and side walls of the first to third trenches so as to completely fill the first to third trenches respectively.

As the metal film ME2, for example, a titanium aluminum (TiAl) film or the like can be suitably used. Incidentally, when a p channel type MISFET is formed, for example, a titanium nitride (TiN) film or the like can be suitably used as the metal film ME2. The metal film ME2 can be formed using, for example, the sputtering method or the like. The metal film ME3 is a conductor film indicative of metal conduction. The metal film ME3 is not limited to a single metal film (pure metal film) or an alloy film but may be a metal compound film (metal nitride film or metal carbide film or the like) indicative of metal conduction. For example, an aluminum (Al) film or the like can be used for the metal film ME3.

Here, for example, the metal film ME2 is formed by a titanium nitride (TiN) film, and the metal film ME3 lying over the titanium nitride film is formed by an aluminum (Al) film. At this time, the aluminum film is preferably made thicker than the titanium nitride film. Since the aluminum film is low in resistance, it is possible to achieve a reduction in the resistance of each gate electrode to be formed later. Further, the metal film ME2 has the role of adjusting work functions of the respective gate electrodes of the n channel type MISFET and the p channel type MISFET. Incidentally, although not shown in the drawing, a conductor film (barrier conductor film) having the role of enhancing mutual adhesion between the metal films ME2 and ME3 is formed between the metal film ME2 and the metal film ME3. The conductor film is included, for example, a titanium (Ti) film.

Figure 19:
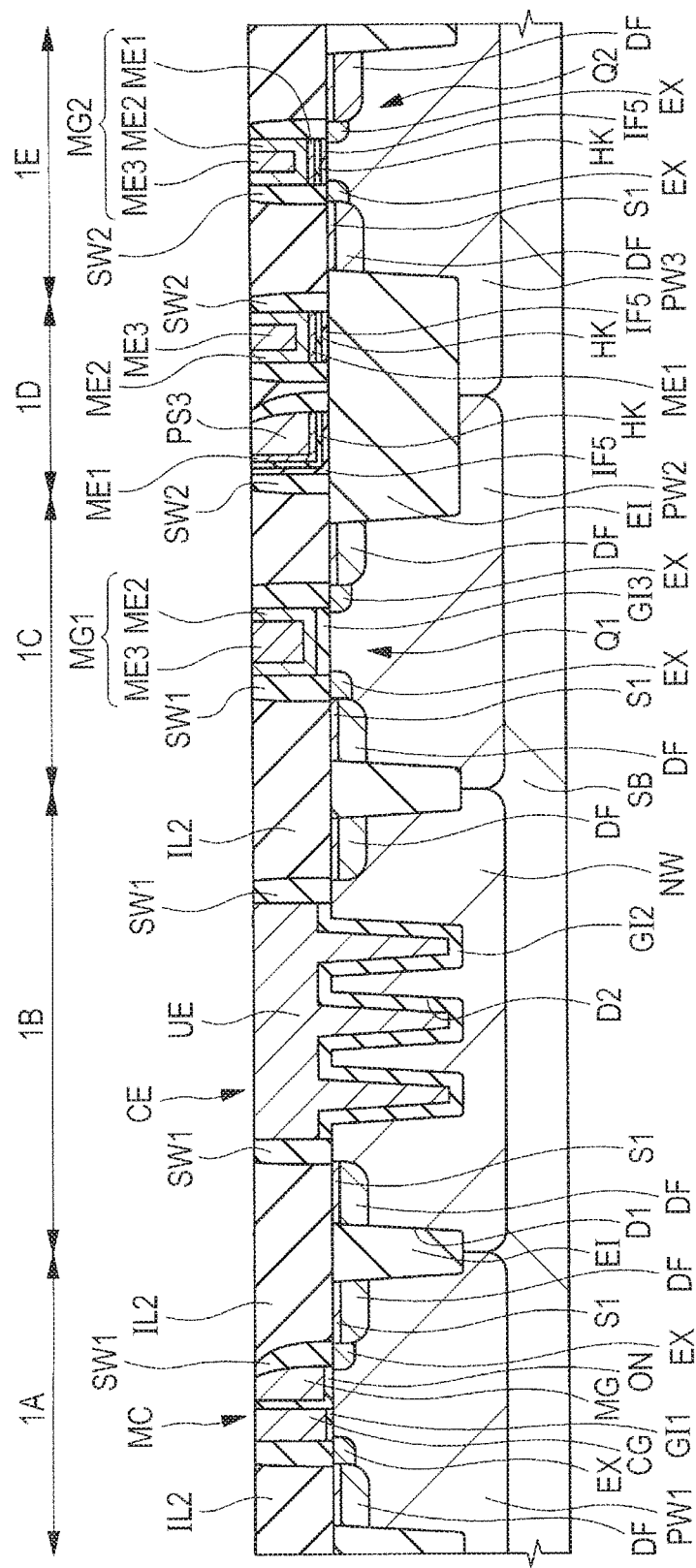
FIG. 19 is a sectional diagram following FIG. 18 in the process of manufacturing the semiconductor device.

Next, as shown in FIG. 19, the external unnecessary metal films ME2 and ME3 of the first to third trenches are polished and removed by the CMP method or the like to thereby leave the metal films ME2 and ME3 inside the first to third trenches. Thus, the respective upper surfaces of the control gate electrode CG, the memory gate electrode MG, the upper electrode UE, and the polysilicon film PS3 are exposed. Also, the gate electrode MG1 included the metal films ME2 and ME3 is formed within the first trench in the high breakdown voltage transistor area 1C by the corresponding polishing process. Further, the gate electrode MG2 including the metal films ME2 and ME3 is formed within the third trench in the low breakdown voltage transistor area 1E. The gate electrode MG2 is configured by the metal films ME1, ME2, and ME3. Further, the metal films ME2 and ME3 are left within the second trench.

Thus, a high breakdown voltage MISFETQ1 is formed in the high breakdown voltage transistor area 1C, and a low breakdown voltage MISFETQ2 is formed in the low breakdown voltage transistor area 1E. The MISFETQ1 is a field effect transistor having the gate electrode MG1 and the source/drain regions located laterally of the gate electrode MG1. The MISFETQ2 is a field effect transistor having the gate electrode MG2 and the source/drain regions located laterally of the gate electrode MG2. The insulating film HK and the insulating film IF5 located directly below the gate electrode MG2 configure the gate insulating film of the MISFETQ2.

The MISFETQ1 is used for driving of the memory cell MC or a circuit which performs the input/output of power between the semiconductor chip being the semiconductor device and the outside of the semiconductor chip. That is, the MISFETQ1 is driven at a high voltage as compared with the control transistor and the MISFETQ2. Therefore, the MISFETQ1 is used for the control transistor and a logic circuit or the like and requires a high breakdown voltage as compared with the MISFETQ2 which requires a high speed operation. Accordingly, the gate insulating film GI13 of the MISFETQ1 needs to have a thickness larger than the gate insulating film GI1 and the gate insulating film of the MISFETQ2.

The gate electrodes MG1 and MG2 are metal gate electrodes respectively. In the present embodiment, the gate electrode G1 is removed and substituted with the gate electrode MG1. Further, the dummy gate electrode DG is removed and substituted with the gate electrode MG2. Therefore, the gate electrode G1 and the dummy gate electrode DG are pseudo gate electrodes and can be assumed to be gate electrodes for substitution.

Further, in the present embodiment, the gate electrodes MG1 and MG2 that are of the metal gate electrodes are formed using the metal films. There can therefore be obtained an advantage that miniaturization of the transistor (thinning of gate insulating film) is made possible.

Figure 20:
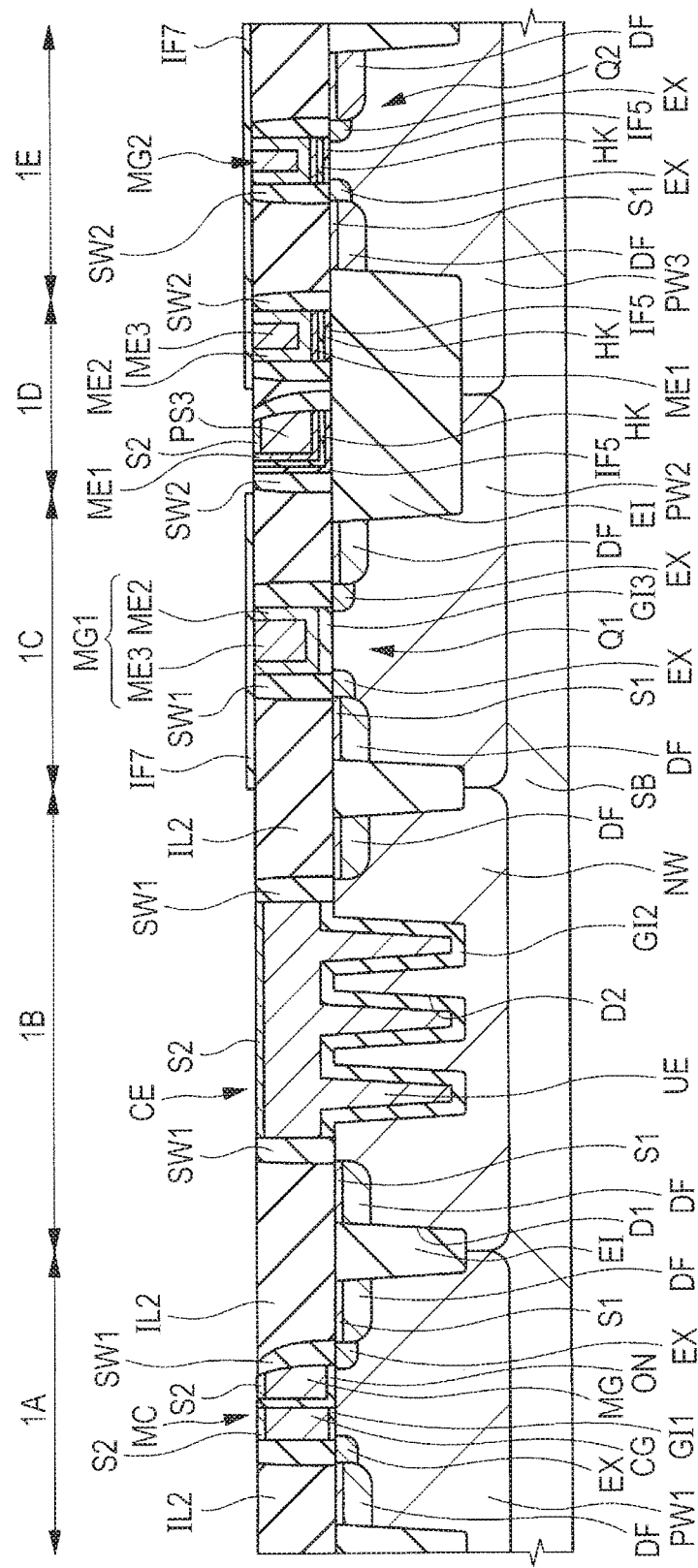
FIG. 20 is a sectional diagram following FIG. 19 in the process of manufacturing the semiconductor device.

Next, as shown in FIG. 20, after an insulating film IF7 is formed over the interlayer insulating film IL2 using, for example, the CVD method, the insulating film IF7 is processed using the photolithography technique and the etching method. Thus, the insulating film IF7 remains in a part of the boundary area 1D, the high breakdown voltage transistor area 1C and the low breakdown voltage transistor area 1E. That is, the insulating film IF7 covers the respective upper surfaces of the gate electrodes MG1 and MG2 and the metal films ME2 and ME3 in the boundary area 1D. Further, the insulating film IF7 does not cover the respective upper surfaces of the control gate electrode CG, the memory gate electrode MG, the upper electrode UE, and the first pattern. The insulating film IF7 is included a silicon oxide film or a silicon nitride film.

Subsequently, a salicide process similar to the process described using FIG. 16 is performed to form a silicide layer S2 over the respective upper surfaces of the control gate electrode CG, the memory gate electrode MG, and the upper electrode UE exposed from the insulating film IF7. Further, the silicide layer S2 is formed even over the upper surface of the polysilicon film PS3 which configures the first pattern. Here, the upper surfaces of the gate electrodes MG1 and MG2 and the metal films ME2 and Me3 are covered by the insulating film IF7 in order to prevent the gate electrodes MG1 and MG2 as the metal gate electrodes and the metal films ME2 and ME3 from being removed together with unreacted metal films upon removing the unreacted metal films after heat treatment in the corresponding salicide process. That is, the insulating film IF7 is a protection film for the gate electrodes MG1 and MG2 and the metal films ME2 and ME3.

Figure 21:
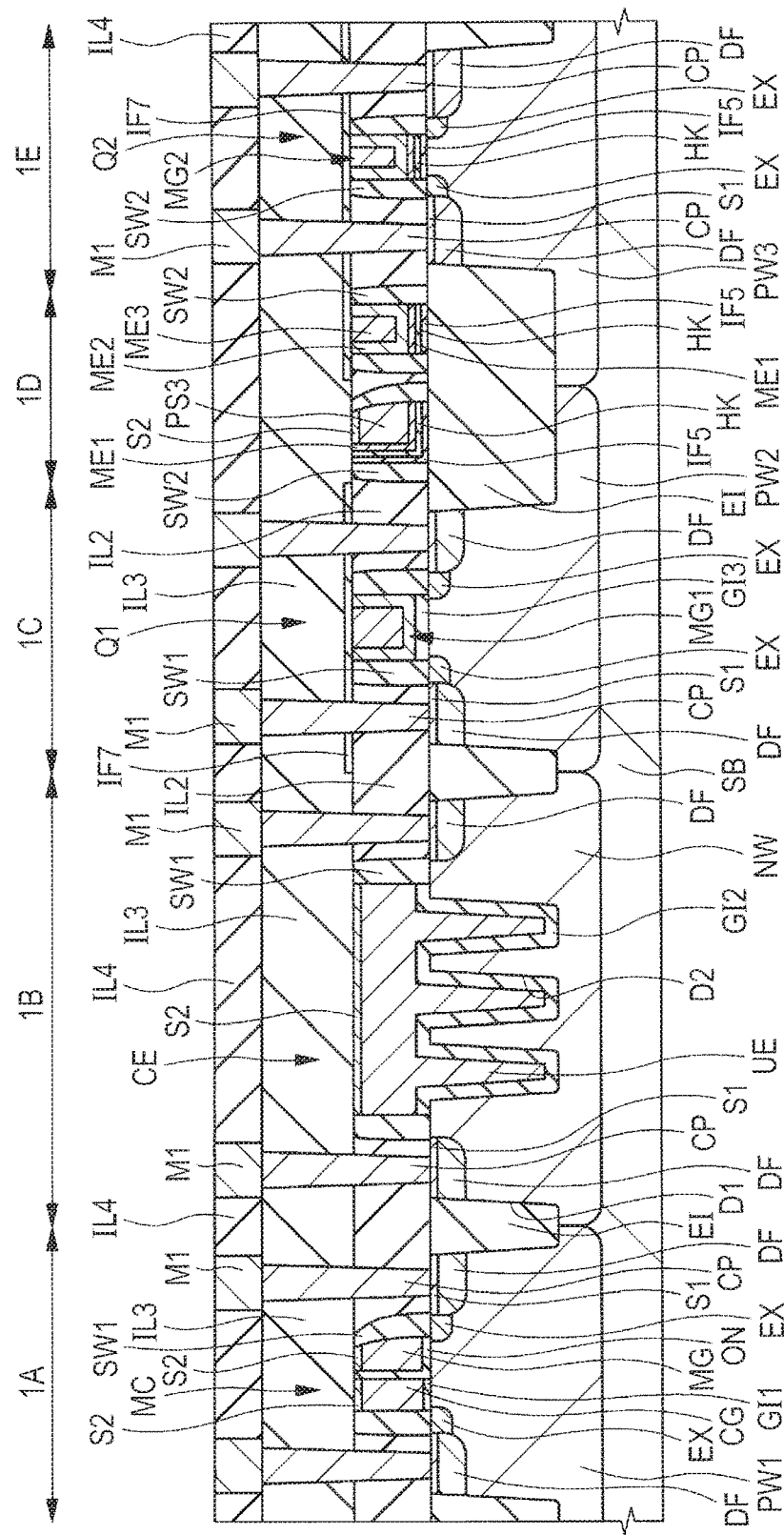
FIG. 21 is a sectional diagram following FIG. 20 in the process of manufacturing the semiconductor device.

Next, as shown in FIG. 21, an interlayer insulating film IL3, a plurality of contact plugs CP, and a plurality of wirings M1 are formed. Here, the interlayer insulating film IL3 which covers the entire upper surface of the semiconductor substrate SB is first formed using, for example, the CVD method. The interlayer insulating film IL3 is included, for example, a silicon oxide film and covers the respective upper surfaces of the control gate electrode CG, the memory gate electrode MG, the gate electrodes MG1 and MG2, the upper electrode UE, the insulating film IF7, and the interlayer insulating film IL2.

Subsequently, the interlayer insulating films IL2 and IL3 and the insulating film IF7 are patterned using the photolithography technique and the dry etching method. Thus, contact holes (openings, through holes) which penetrate the interlayer insulating films IL2 and IL3, and contact holes which penetrate the interlayer insulating films IL2, IL3 and IF7 are formed in plural respectively. At the bottoms of the respective contact holes, the silicide layer S1 lying over the surface of each diffusion layer DF, the silicide layer S2 lying over the surface of the control gate electrode G0, the silicide layer S2 lying over the surface of the memory gate electrode MG, and the silicide layer S2 lying over the surfaces of the gate electrodes MG1 and MG2 or the upper surface of the upper electrode UE are exposed.

Incidentally, only the contact holes each located directly above the upper surface of each diffusion layer DF are illustrated in FIG. 21. The contact holes located directly above the control gate electrode CG, the memory gate electrode MG, the gate electrodes MG1 and MG2, and the upper electrode UE are made open in unillustrated areas. No contact holes are formed directly above the first pattern formed in the boundary area 1D and the second pattern including the metal films ME2 and ME3. The first pattern and the second pattern respectively have a gate electrode-like structure, but do not configure circuits in a semiconductor device to be completed later. That is, the first pattern and the second pattern are dummy patterns.

Subsequently, conductive contact plugs CP each principally included tungsten (W), for example are formed in plural within the respective contact holes as coupling conductors. In order to form the contact plugs CP, for example a barrier conductor film (e.g., titanium film, titanium nitride film or laminated film of them) is formed over the interlayer insulating film IL3 including the inside of each contact hole. Then, a main conductor film included a tungsten film or the like is formed over the barrier conductor film so as to completely fill each contact hole, and thereafter the unnecessary main conductor film and barrier conductor film lying outside the contact holes are removed by the CMP method or etchback method or the like, whereby the contact plugs CP can be formed. Incidentally, for simplification of the drawing, the barrier conductor film and the main conductor film (tungsten film) which configure each contact plug CP are integrally illustrated in FIG. 21.

Each contact plug CP is electrically coupled to the diffusion layer DF through the silicide layer S1. The contact plugs CP are electrically coupled to the control gate electrode CG, the memory gate electrode MG, and the upper electrode UE through the silicide layers S2. The contact plugs CP are coupled to the upper surfaces of the gate electrodes MG1 and MG2.

Incidentally, the contact plugs CP directly above the control gate electrode CG, the memory gate electrode MG, the upper electrode UE, and the gate electrodes MG1 and MG2 are not illustrated in the sectional diagram of FIG. 21. That is, the contact plugs CP are coupled to the control gate electrode CG, the memory gate electrode MG, the upper electrode UE, and the gate electrodes MG1 and MG2 respectively in the unillustrated areas. Incidentally, the upper surface of each contact plug CP and the upper surface of the interlayer insulating film IL3 are planarized in the same plane.

Subsequently, a first wiring layer including a first layer wiring M1 is formed over the interlayer insulating film IL3 embedded with each contact plug CP. The wiring M1 can be formed by using a so-called single damascene technique. The first wiring layer has an interlayer insulating film IL4 and the first layer wiring M1 which penetrates the interlayer insulating film IL4. The bottom face of the wiring M1 is coupled to the upper surface of each contact plug CP. Although the illustration of subsequent processes is omitted, a second wiring layer and a third wiring layer, etc. are sequentially formed over the first wiring layer to form a laminated wiring layer. Afterwards, a semiconductor wafer is diced by a dicing process to obtain a plurality of semiconductor chips.

A plan diagram of the semiconductor chip is shown in FIG. 22. As shown in FIG. 22, the memory cell area 1A, the capacitive element area 1B, the high breakdown voltage transistor area 1C, the boundary area 1D, and the low breakdown voltage transistor area 1E exist on the main surface side of the semiconductor chip CHP. The memory cell area 1A, the capacitive element area 1B, and the high breakdown voltage transistor area 1C are respectively surrounded by the boundary area 1D. That is, the memory cell area 1A, the capacitive element area 1B and the high breakdown voltage transistor area 1C, and the low breakdown voltage transistor area 1E are separated from each other via the boundary area 1D. In the boundary area 1D, the above first pattern is formed on the memory cell area 1A side, the capacitive element area 1B side or the high breakdown voltage transistor area 1C side, and the above second pattern is formed on the low breakdown voltage transistor area 1E side.

In other words, the element isolation region EI and dummy patterns formed in the boundary area 1D shown in FIG. 21 respectively have an annular structure as seen in the plane. The memory cell area 1A, the capacitive element area 1B, and the high breakdown voltage transistor area 1C are respectively surrounded by the element isolation region EI and the dummy patterns formed in the boundary area 1D as seen in the plane.

The semiconductor device according to the present embodiment is manufactured in the above-described manner. Incidentally, although a so-call high-k first manufacturing method that the insulating film HK shown in FIG. 21 is formed before the formation of the dummy gate electrode has been described here by way of example, a so-called high-k last manufacturing method that the insulating film HK is formed after the removal of the dummy gate electrode may be used. When the high-k last manufacturing method is adopted, for example, the dummy gate electrode included the polysilicon film PS1 is formed over the main surface of the semiconductor substrate SB through the insulating film IF1 in the low breakdown voltage transistor area 1E in the process described using FIG. 7 after the processes described using FIG. 1 through FIG. 6.

Thereafter, of the processes described using FIG. 10 through FIG. 14, those other than the process of forming the well PW3 and the process of forming each extension region EX are not performed. Then, after execution of the processes described using FIG. 15 through FIG. 17, a high-k film is formed over the main surface of the semiconductor substrate SB and subsequently a metal film to be a metal gate electrode is deposited to thereby fill the trench lying over each gate insulating film. Subsequent processes are performed in a manner similar to the method described using FIG. 19 through FIG. 21.

The memory cell MC in the present embodiment uses a high voltage for write-in and erase operations. A power supply generation circuit thereof needs a large-scale capacitive element CE and a high breakdown voltage MISFETQ1 for the purpose of charge storage and smoothing. The capacitive element CE is increased in capacity per unit area by embedding a part of the upper electrode UE into each trench D2, thereby making it possible to downsize a semiconductor chip.

In the capacitive element CE in the present embodiment, the facing area between the upper electrode UE and the lower electrode (semiconductor substrate) can be increased by embedding the part of the upper electrode UE into the trenches D2. That is, the capacity of the capacitive element CE can be increased as compared with the case where the upper electrode is formed over the flat semiconductor substrate (lower electrode) through the insulating film.

Incidentally, although the manner in which the semiconductor elements are formed in the respective areas one by one is shown in FIG. 1 through FIG. 21, a plurality of memory cells MC are actually formed side by side in an array form in, for example, a memory cell area 1A, for example. Similarly, elements are formed side by side in plural in an array form, for example in like manner even in a capacitive element area 1B, a plurality of high breakdown voltage transistor areas 1C, and a low breakdown voltage transistor area 1E.

<Concerning Operation of Nonvolatile Memory>

An example of the operation of the nonvolatile memory will next be described with reference to FIG. 24.

FIG. 24 is a table showing one example of conditions for application of voltages to respective parts of a selected memory cell at the time of "write-in", "erase", and "read-out" in the present embodiment. A voltage Vmg applied to the memory gate electrode MG of such a memory cell MC as shown in FIG. 21, a voltage Vs applied to the source region, a voltage Vcg applied to the control gate electrode CG, a voltage Vd applied to the drain region, and a base voltage Vb applied to the p-type well PW1 lying over the semiconductor substrate are described in the table of FIG. 24 at the time of "write-in", "erase", and "read-out", respectively. The selected memory cell mentioned herein refers to a memory cell selected as an object to perform "write-in", "erase" or "read-out". Incidentally, in the example of the nonvolatile memory shown in FIG. 21, the right active region of the memory gate electrode MG corresponds to the source region, and the left active region of the control gate electrode CO corresponds to the drain region.

Incidentally, the conditions shown in the table of FIG. 24 are one suitable example of the conditions for voltage application and not limited thereto. The conditions may be changed in various ways as needed. Further, in the present embodiment, the injection of electrons into the silicon nitride film being the charge storage part in the ONO film CN (refer to FIG. 21) of the memory transistor is defined as "write-in", and the injection of holes (positive holes) is defined as "erase".

Further, in the table of FIG. 24, a column A corresponds to a case where a write-in method is an SSI system and an erase method is a BTBT system. A column B corresponds to a case where the write-in method is the SSI system and the erase method is an FN system. A column C corresponds to a case where the write-in method is the FN system and the erase method is the BTBT system. A column D corresponds to a case where the write-in method is the FN system and the ease method is the FN system.

The SSI system can be assumed to be an operation method of performing write-in of a memory cell by injecting hot electrons into the silicon nitride film. The BTBT system can be assumed to be an operation method of performing erasure of the memory cell by injecting hot electrons into the silicon nitride film. The FN system can be assumed to be an operation method of performing write-in or erasure by tunneling of electrons or holes. If the FN system is mentioned in another expression, the write-in of the FN system can be assumed to be an operation system which performs write-in of the memory cell by injecting electrons into the silicon nitride film by an FN tunnel effect. The erasure of the FN system can be assumed to be an operation system which performs erasure of the memory cell by injecting holes into the silicon nitride film by the FN tunnel effect. They will be specifically described below.

The write-in method includes a write-in system (hot electron injection write-in system) which performs write-in by a hot electron injection based on a source side injection called a so-called SSI (Source Side Injection) system, and a write-in system (tunneling write-in system) which performs write-in by FN (Fowler Nordheim) tunneling referred to as a so-called FN system.

In terms of the write-in of the SSI system, the write-in is performed by applying such voltages (Vmg=10V, Vs=5 V, Vcg=1 V, Vd=0.5 V, and Vb=0 V) as shown in "write-in operation voltage" in the column A or B of the table of FIG. 24, for example, to the respective parts of the selected memory cell to perform write-in and injecting electrons into the silicon nitride film in the ONO film ON of the selected memory cell.

At this time, the hot electrons are generated in a channel region (between the source and drain) below between the two gate electrodes (memory gate electrode MG and control gate electrode CG). The hot electrons are injected into the silicon nitride film being the charge storage part in the ONO film ON below the memory gate electrode MG. The injected hot electrons (electrons) are captured by trap levels in the silicon nitride film in the ONO film ON. As a result, the threshold voltage of the memory transistor is raised. That is, the memory transistor comes into a write-in state.

In terms of the write-in of the FN system, the write-in is performed by applying such voltages (Vmg=−12V, Vs=0 V, Vcg=0 V, Vd=0 V, and Vb=0 V) as shown in "write-in operation voltage" in the column C or D of the table of FIG. 24, for example, to the respective parts of the selected memory cell to perform write-in and tunneling electrons from the memory gate electrode MG in the selected memory cell to inject them into the silicon nitride film in the ONO film ON. At this time, the electrons are tunneled from the memory gate electrode MG to the second silicon oxide film (top oxide film) by the FN tunneling (FN tunnel effect) and injected into the ONO film ON, and captured by trap levels in the silicon nitride film in the ONO film ON. As a result, the threshold voltage of the memory transistor is raised. That is, the memory transistor comes into a write-in state.

Incidentally, in terms of the write-in of the FN system, the write-in can also be performed by tunneling electrons from the semiconductor substrate SB to inject them into the silicon nitride film in the ONO film ON. In this case, the write-in operation voltages can be assumed to be those obtained by inverting the "write-in operation voltage" in the column C or D in the table of FIG. 24, for example in terms of its positive/negative.

The erase method includes an erase system (hot hole injection erase system) which performs erasure by a hot hole injection based on BTBT (Band-to-Band Tunneling) referred to as the so-called BTBT system, and an erase system (tunneling erase system) which performs erasure by the FN (Fowler Nordheim) tunneling referred to as the FN system.

In terms of the erasure of the BTBT system, the erasure is performed by injecting holes (positive holes) generated by BTBT into the charge storage part (silicon nitride film in ONO film ON). Such voltages (Vmg=−6 V, Vs=6 V, Vcg=0 V, Vd=open, and Vb=0 V) as shown in "erase operation voltage" in the column A or C of the table of FIG. 24, for example, are applied to the respective parts of the selected memory cell to perform erasure. Thus, holes are generated by BTBT and accelerated by an electric field, and thereby followed by being injected into the silicon nitride film in the ONO film ON of the selected memory cell, whereby the threshold voltage of the memory transistor is lowered. That is, the memory transistor comes into an erase state.

In terms of the erasure of the FN system, the erasure is performed by applying such voltages (Vmg=12 V, Vs=0 V, Vcg=0 V, Vd=0 V, and Vb=0 V) as shown in "erase operation voltage" in the column B or D of the table of FIG. 24, for example to the respective parts of the selected memory cell to perform erasure, and tunneling holes from the memory gate electrode MG in the selected memory cell to inject them into the silicon nitride film in the ONO film ON. At this time, the holes are tunneled from the memory gate electrode MG to the second silicon oxide film (top oxide film) by the FN tunneling (FN tunnel effect) and thereby injected into the ONO film ON, and captured by trap levels in the silicon nitride film in the ONO film ON. As a result, the threshold voltage of the memory transistor is lowered. That is, the memory transistor comes into an erase state.

Incidentally, in terms of the erasure of the FN system, the erasure can also be performed by tunneling holes from the semiconductor substrate SB to inject them into the silicon nitride film in the ONO film ON. In this case, the erase operation voltages can be assumed to be those obtained by inverting the "erase operation voltage" in the column B or D of the table of FIG. 24, for example in terms of its positive/negative.

At the time of read-out, such voltages as shown in "read-out operation voltage" in the column A, B, C or D of the table of FIG. 24, for example are applied to the respective parts of the selected memory cell to perform read-out. The write-in state and the erase state can be determined by setting the voltage Vmg applied to the memory gate electrode MG at the time of read-out to a value between the threshold voltage of the memory transistor in the write-in state and the threshold voltage thereof in the erase state.

Next, each voltage to be applied in the above operation will be described. A voltage of a supply power source from the outside to a product chip is for example, 1.5V for a low breakdown voltage MISFET, and 5V for a high breakdown voltage MISFET. In the memory operation, voltages other than these are generated by a voltage generation circuit in the chip. For example, a voltage of 10V for Vmg at the time of SSI write-in, which is a relatively high voltage is generated by a voltage generation circuit included a high breakdown voltage MISFET. The voltage generation circuit needs such a capacitive element as shown in the capacitive element area 1B of FIG. 21 for the purpose of charge storage or voltage smoothing or the like.

Effects of the Present Embodiment

Problems in the case of forming a semiconductor device according to a comparative example, i.e., a semiconductor device having a split gate type MONOS memory, a trench-type capacitive element, a high-resistant transistor, and a low-resistant transistor, in which an insulating film between electrodes of the trench-type capacitive element and a gate insulating film of a high breakdown voltage transistor are formed in separate processes will hereinafter be described. Effects of the present embodiment will be described. Here, FIG. 26 through FIG. 32 show sectional diagrams in the process of manufacturing the semiconductor device according to the comparative example, and FIG. 33 shows a plan diagram in the process of manufacturing the semiconductor device according to the comparative example.

FIG. 26 through FIG. 32 show the cross sections of a plurality of areas (memory cell area A, capacitive element area 1B, high breakdown voltage transistor area 1C, boundary area 1D, and low breakdown voltage transistor area 1E) corresponding to the respective areas shown in FIG. 1 through FIG. 21. Incidentally, in order to show that the high breakdown voltage transistor area 1C is located outside the boundary area 1D, the high breakdown voltage transistor area 1C and the boundary area 1D are displayed after being exchanged in position in FIG. 26 through FIG. 32 unlike FIG. 1 through FIG. 21. That is, FIG. 26 through FIG. 32 show the cross sections of the memory cell area 1A, the capacitive element area 1B, the boundary area 1D, the high breakdown voltage transistor area 1C, and the low breakdown voltage transistor area 1E in order from the left side to the right side in the drawings.

Figure 33:
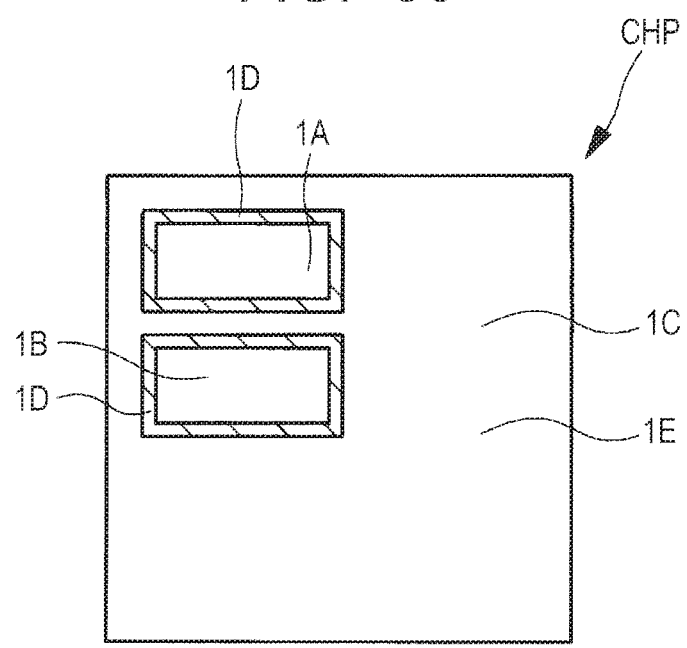
FIG. 33 is a plan diagram in the process of manufacturing a semiconductor device showing a comparative example.

FIG. 33 showing a plan diagram of the comparative example is different from FIG. 22 showing the plan diagram of the embodiment in that the high breakdown voltage transistor area 1C is laid out outside the boundary area 1D. Accordingly, the comparative example requires no boundary area 1D in the layout of the high breakdown voltage transistor area 1C and has the effect of reducing a layout area, but on the other hand has problems too. They will be described below, and the effects of the present embodiment will be described.

Each of the semiconductor devices according to the present embodiment and the comparative example is adapted to one in which the MISFETQ1 in the high breakdown voltage transistor area 1C and the MISFETQ2 in the low breakdown voltage transistor area 1E are formed using the gate last process as described using FIG. 1 through FIG. 22. That is, in the present embodiment and the comparative example, the dummy gate electrode is formed and covered by the interlayer insulating film. Thereafter, the upper surface of the dummy gate electrode is exposed by the polishing process. Afterwards, the dummy gate electrode is replaced with the metal gate electrode. If the gate last process is used, it is possible to reduce a thermal load to be received by the metal gate electrode.

Since the above polishing process of polishing the upper portions of the gate electrodes is performed in such a gate last process, it is difficult to form a capacitive element including a laminated film of a first conductor film (lower electrode) and a second conductor film (upper electrode) formed over the semiconductor substrate. This is because even though the second conductor film is formed over the first conductor film, the second conductor film is removed by the polishing process. Thus, in the present embodiment and the following comparative example, a capacitive element is formed in which a semiconductor substrate is used as a lower electrode and a polysilicon film lying over the semiconductor substrate is used as an upper electrode.

Further, in the present embodiment and the following comparative example, trenches are formed in a main surface of the semiconductor substrate by a dry etching method, and a part of the upper electrode is embedded into the trenches. Thus, the capacity of the capacitive element can be increased by increasing a facing area between the upper electrode and the semiconductor substrate. In the present application, such an element may be called a trench capacitive element.

In the manufacturing process of the semiconductor device according to the comparative example, first, processes similar to the processes described above using FIG. 1 through FIG. 6 are performed to form an insulating film IF1 used to insulate two electrodes of the trench capacitive element over a semiconductor substrate SB formed with trenches D2, and form an insulating film IF2 in a memory cell area 1A. The insulating film IF1 formed here needs to have a high insulating property in such a manner as to withstand a potential difference between voltages applied to the upper and lower electrodes of the trench capacitive element to be formed later. Therefore, the insulating film IF1 has a film thickness larger than that of the insulating film IF2 for a gate insulating film of a control gate electrode to be formed later and that of a gate insulating film for a low breakdown voltage transistor to be formed later.

Figure 26:
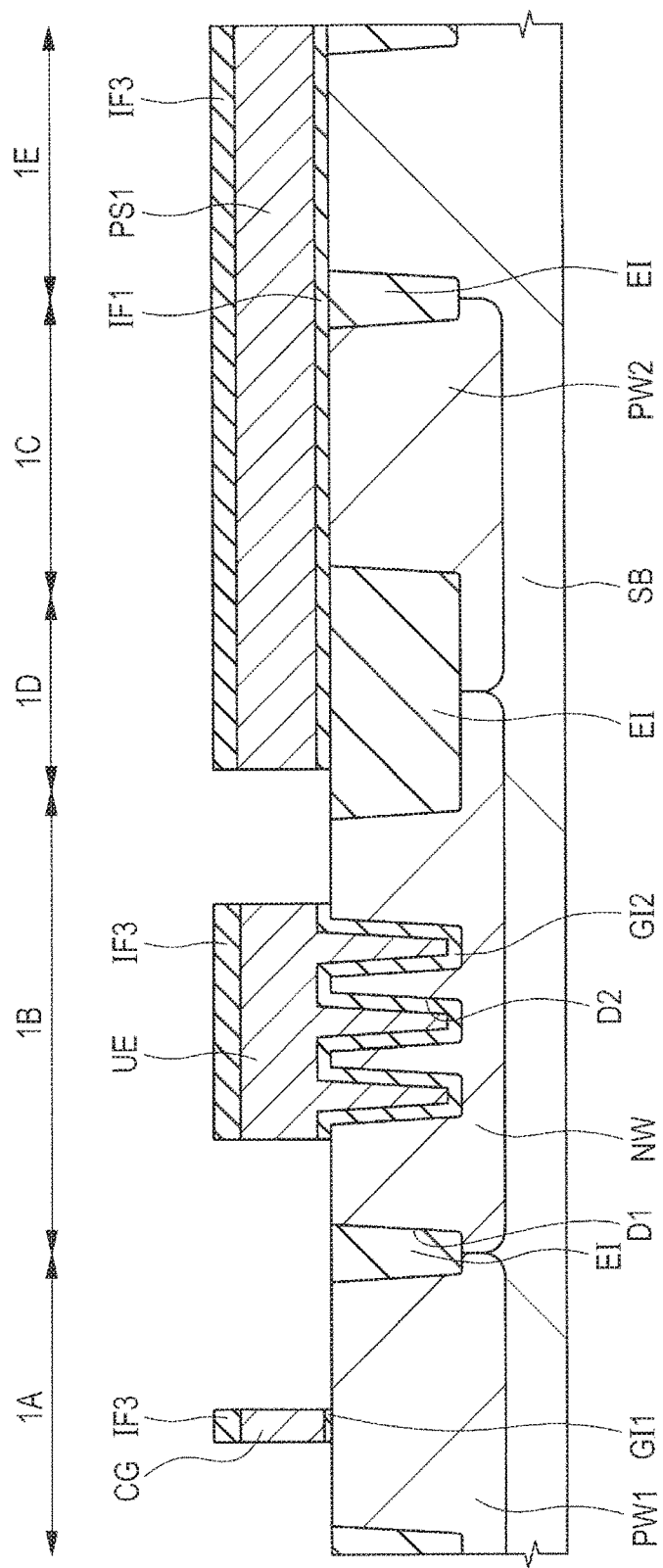
FIG. 26 is a sectional diagram in the process of manufacturing a semiconductor device showing a comparative example.

Next, as shown in FIG. 26, a polysilicon film PS1 and an insulating film IF3 are sequentially formed over the insulating films IF1 and IF2. One or both of n-type and p-type impurities are implanted into the polysilicon film PS1. Thereafter, a laminated film included the insulating film IF3, the polysilicon film PS1, and the insulating film IF2 in the memory cell area 1A, and a laminated film included the insulating film IF3, the polysilicon film PS1, and the insulating film IF1 in the capacitive element area 1B are patterned.

Thus, a gate insulating film GI1 including the insulating film IF2 and a control gate electrode CG including the polysilicon film PS1 are formed in the memory cell area 1A. An upper electrode UE included the polysilicon film PS1 and a gate insulating film GI2 including the insulating film IF1 are formed in the capacitive element area 1B. The semiconductor substrate SB in the boundary area 1D, the high breakdown voltage transistor area 1C, and the low breakdown voltage transistor area 1E is covered by a laminated film included the insulating film IF3, the polysilicon film PS1, and the insulating film IF1.

Figure 27:
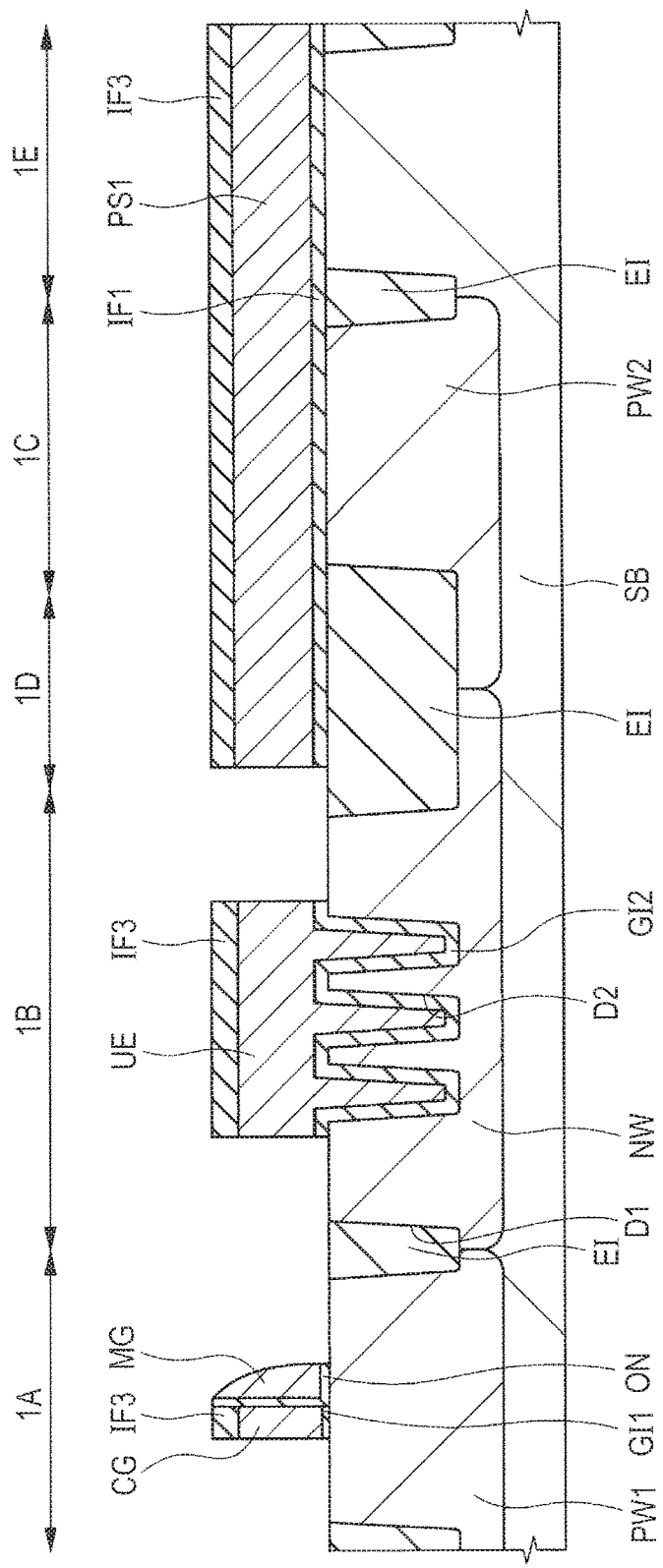
FIG. 27 is a sectional diagram following FIG. 26 in the process of manufacturing the semiconductor device.

Next, as shown in FIG. 27, the processes described using FIG. 8 and FIG. 9 are performed to form an ONO film CN and a memory gate electrode MG in the memory cell area 1A.

Figure 28:
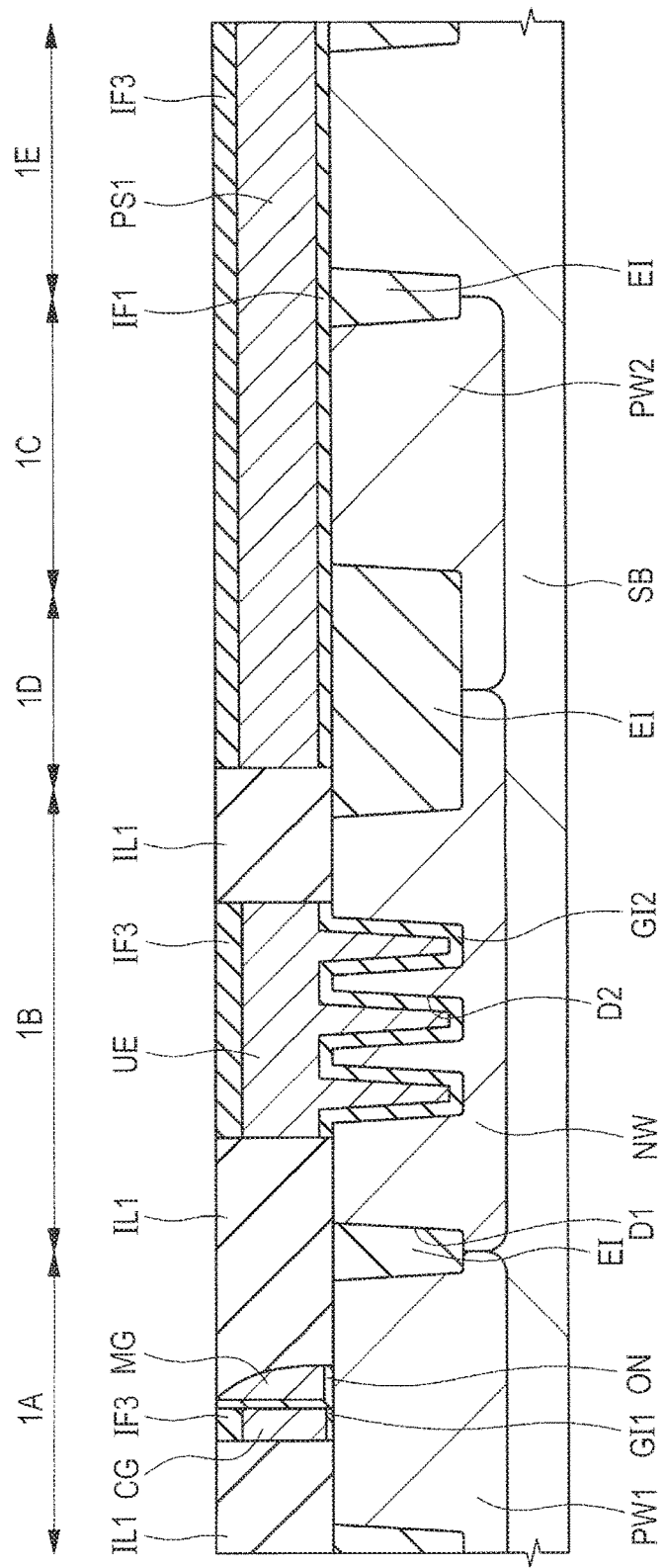
FIG. 28 is a sectional diagram following FIG. 27 in the process of manufacturing the semiconductor device.

Next, as shown in FIG. 28, a process similar to the process described using FIG. 10 is performed. Thus, an interlayer insulating film IL1 is embedded between a pattern including the gate insulating film GI1, the insulating film IF3, the control gate electrode CG, and the memory gate electrode MG in the memory area 1A, a laminated film included the gate insulating film GI2, the upper electrode UE, and the insulating film IF3 in the capacitive element area 1B, and a laminated film included the polysilicon film PS1 and the insulating films IF1 and IF3 in the high breakdown voltage transistor area 1C or the like.

Figure 29:
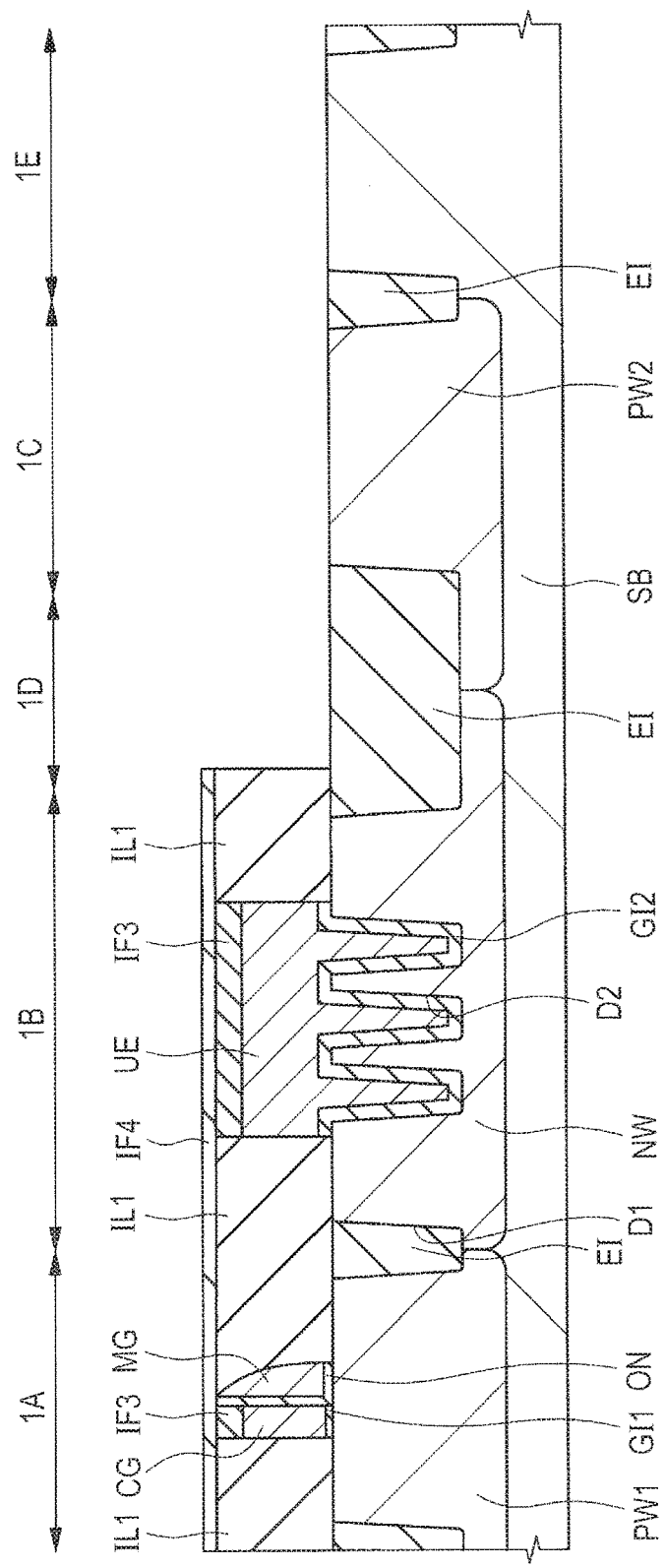
FIG. 29 is a sectional diagram following FIG. 28 in the process of manufacturing the semiconductor device.

Next, as shown in FIG. 29, a process similar to the process described using FIG. 11 is performed to remove the laminated film included the insulating film IF3, the polysilicon film PS1, and the insulating film IF1 in a part of the boundary area 1D, the high breakdown voltage transistor area 1C, and the low breakdown voltage transistor area 1E, thereby exposing the main surface of the semiconductor substrate SB.

Figure 30:
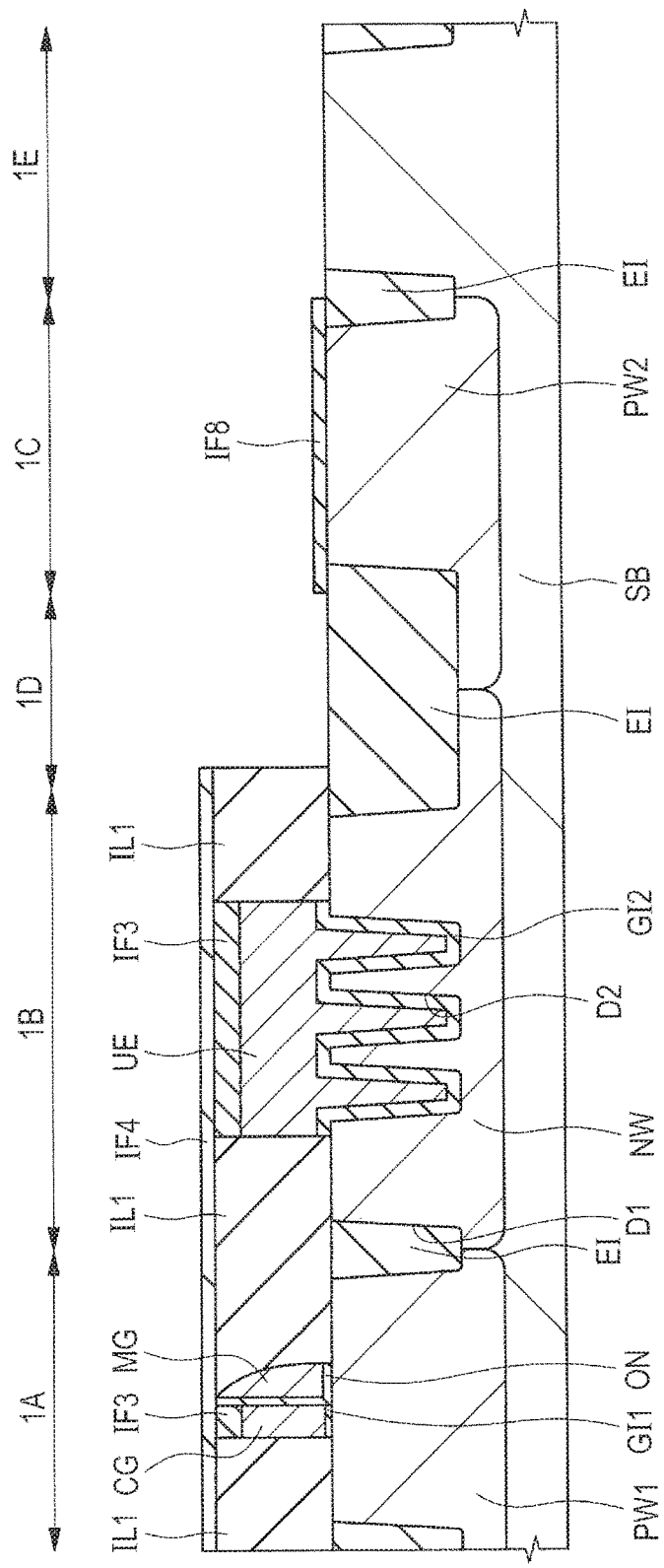
FIG. 30 is a sectional diagram following FIG. 29 in the process of manufacturing the semiconductor device.

Next, as shown in FIG. 30, an insulating film IF8 larger in film thickness than the gate insulating film GI1 is formed over the main surface of the semiconductor substrate SB. Afterwards, the insulating film IF8 other than in the high breakdown voltage transistor area 1C is removed using a photolithography technique and an etching method. The insulating film IF8 is a film which serves as a part of a gate insulating film for a high breakdown voltage transistor to be formed in a subsequent process. The thickness of the insulating film IF8 is 16 nm, for example.

Figure 31:
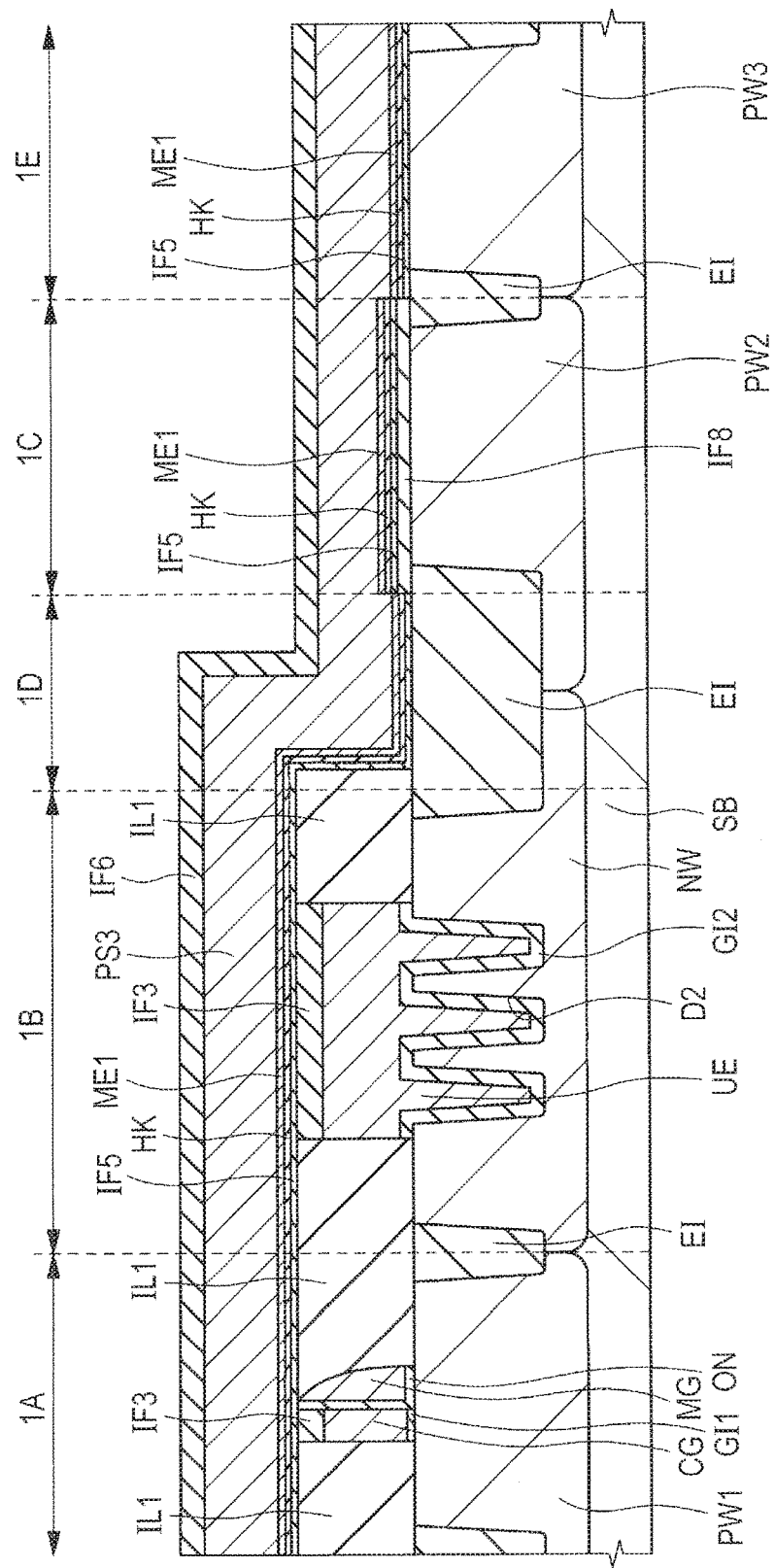
FIG. 31 is a sectional diagram following FIG. 30 in the process of manufacturing the semiconductor device.

Next, as shown in FIG. 31, a process similar to the process described using FIG. 12 is performed. That is, an insulating film IF5, an insulating film HK being a high-k film, a polysilicon film PS3, a metal film ME1, and an insulating film IF6 are formed in order over the main surface of the semiconductor substrate SB.

Figure 32:
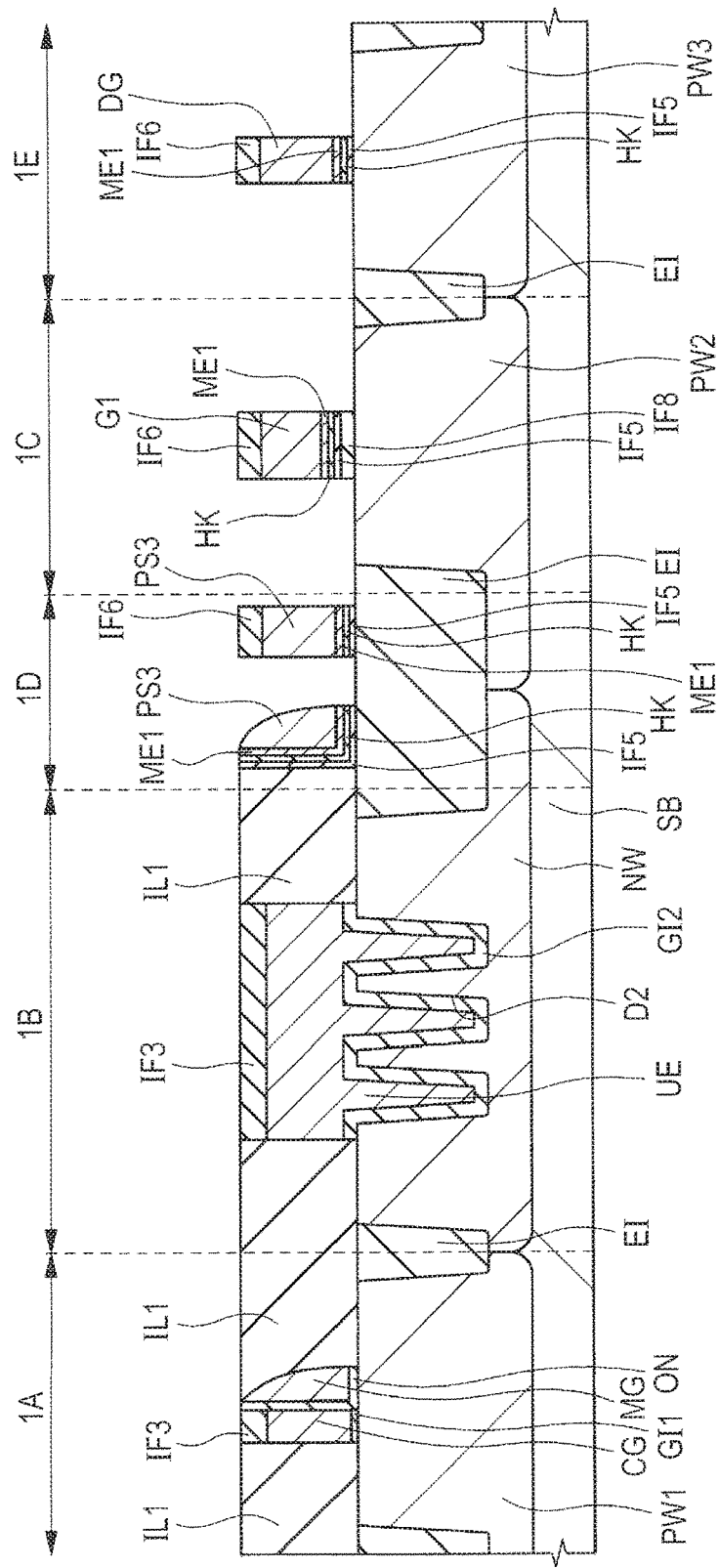
FIG. 32 is a sectional diagram following FIG. 31 in the process of manufacturing the semiconductor device.

Next, as shown in FIG. 32, the insulating film IF6, the polysilicon film PS3, the metal film ME1, and the insulating films HK and IF5 are patterned to form a gate insulating film included the insulating films IF8, IF5 and HK, and a gate electrode G1 being a dummy gate electrode included the polysilicon film PS3 in the high breakdown voltage transistor area 1C. Further, a gate insulating film included the insulating films IF5 and HK in the low breakdown voltage transistor area 1E, and a dummy gate electrode DG included the polysilicon film PS3 are formed by the corresponding patterning. As subsequent processes, processes similar to the processes described using FIG. 14 through FIG. 22 are performed to complete the semiconductor device according to the comparative example.

In the above comparative example, first, the gate insulating film GI2 is formed in the processes described using FIG. 4 through FIG. 6 and FIG. 28. Thereafter, the insulating film IF8 used as the part of the gate insulating film of the high breakdown voltage transistor is formed in the process described using FIG. 30. The gate insulating film GI12 and the insulating film IF8 both need a relatively large film thickness to increase the breakdown voltages of the capacitive element and the high breakdown voltage transistor. That is, the insulating film IF1 to be the gate insulating film G12 (refer to FIG. 32) later, and the insulating film IF8 are required to be formed by processes different from the process of forming the insulating film IF2 (refer to FIG. 6) to be the gate insulating film GI1 (refer to FIG. 32) of the control transistor and the process of forming the gate insulating film of the low breakdown voltage transistor. Thus, the low breakdown voltage transistor, the high breakdown voltage transistor, and the capacitive element need to separately form the gate insulating films.

Here, when the gate insulting film of the high breakdown voltage transistor and the gate insulating film of the capacitive element are separately formed as in the above comparative example, the processes of forming the insulating films are increased, thereby causing a problem that the manufacturing cost of the semiconductor device is increased.

Further, when the insulating film for the gate insulting film of the high breakdown voltage transistor is partly remove where the gate insulating films are separately formed between the high breakdown voltage transistor and the capacitive element, the upper surface of the element isolation region exposed from the corresponding insulating film processed in this way is retreated. Therefore, a level difference is generated on the main surface of the wafer including the upper surface of each element isolation region.

That is, in the process of processing the insulating film IF1 described using FIG. 5, the upper surface of the element isolation region EI in the area other than the capacitive element area 1B, the boundary area 1D, the high breakdown voltage transistor area 1C, and the low breakdown voltage transistor area 1E is retreated by the first etching. Thereafter, in the process of removing the insulating film IF1 described using FIG. 29, the upper surface of the element isolation region EI in all the areas other than the memory cell area 1A and the capacitive element area 1B is retreated by the second etching. Further, in the process of processing the insulating film IF8 described using FIG. 30, the upper surface of the element isolation region EI in the part of the boundary area 1D, the high breakdown voltage transistor area 1C, and the low breakdown voltage transistor area 1E is retreated by the third etching. Accordingly, the upper surface of the element isolation region EI subjected to a plurality of times of etching for removing the thick gate insulating films is greatly retreated.

The level difference formed in this way becomes the cause of causing a difference in height between the gate electrodes or the like when aligning the heights of the upper surfaces of the in-plane gate electrodes or the like on the main surface side of the wafer by performing polishing as described using FIG. 17 in the gate last process, thus interfering with the normal film deposition. Further, there occurs an adverse effect that the characteristic of the low breakdown voltage transistor narrow in the width of the channel region changes.

Incidentally, as a countermeasure against this problem, there is considered a method of lowering in advance the height of the element isolation region EI in the area small in the number of times that it is subjected to etching for removing the thick gate insulating films. However, when the thick gate insulating films in the capacitive element area 1B and the high breakdown voltage transistor area 1C are separately formed by the separate processes as in the comparative example, the method complicates the manufacturing method of the semiconductor device, increases its manufacturing cost, and deteriorates process controllability.

Thus, in the present embodiment, the gate insulating film GI3 of the high breakdown voltage MISFETQ1 shown in FIG. 21 and the gate insulating film GI2 of the capacitive element CE are formed by the same insulating film IF1 (refer to FIG. 6). As shown in FIG. 7, the gate insulating films GI2 and GI3 are respectively processed and formed by one etching process. That is, while the etching process for forming the gate insulating films thick relatively is performed three times in the comparative example, the number of etching processes is reduced to twice here. That is, in the present embodiment, the above third etching process performed in the manufacturing process of the comparative example can be omitted. Thus, it is possible to simplify the manufacturing process of the semiconductor device and reduce the manufacturing cost thereof.

Further, since there is no need to previously form low, the upper surface of the element isolation region EI small in the number of times that it is subjected to etching for processing the thick gate insulating films for the purpose of maintaining the flatness of the upper surface of the wafer, the manufacturing process of the semiconductor device can be simplified and the manufacturing cost thereof can be reduced.

Also, thus, the upper surface of the element isolation region EI can be prevented from being greatly retreated by etching. That is, due to the process of processing the insulating film IF1 described using FIG. 5, the upper surface of the element isolation region EI is retreated by the first etching in the area other than the capacitive element area 1B, the boundary area 1D, the high breakdown voltage transistor area 1C, and the low breakdown voltage transistor area 1E. Thereafter, in the process of processing the insulating film IF1 described using FIG. 11, the upper surface of the element isolation region EI in the part of the boundary area 1D and the low breakdown voltage transistor area 1E is retreated by the second etching.

In the comparative example, subsequently, the third etching, i.e., etching to be performed in order to leave the insulating film IF8 only in the high breakdown voltage transistor area 1C as shown in FIG. 30 is executed. In the present embodiment, however, the insulating film IF1 formed in the process described using FIG. 4 is processed in the etching process described using FIG. 7 to simultaneously form the gate insulating film GI1 in the capacitive element area 1B and the gate insulating film GI3 in the capacitive element area 1B. Therefore, there is no need to perform the third etching in the comparative example. Thus, in the present embodiment, since the number of times that the element isolation region EI is subjected to the etching for processing the relatively thick insulating films can be reduced as compared with the comparative example, the upper surface of the element isolation region EI can be prevented from being greatly retreated.

Thus, it is possible to prevent irregularities from being generated within the plane an the main surface side of the wafer due to the level difference between the upper surface of the element isolation region EI and the main surface of the semiconductor substrate SB. That is, since it is possible to reduce the amount of sinking of the upper surface of the element isolation region (isolation oxide film) EI, there can be obtained an effect that uniformity of the film thickness of the gate electrode or the like after the polishing process (refer to FIG. 17) in the gate last process is enhanced. That is, since it is possible to improve the flatness of the upper surface of the film formed over the main surface of the semiconductor substrate SB and normally form other films laminated over the corresponding film, the reliability of the semiconductor device can be improved. Also, since it is possible to prevent a variation in the characteristic of the low breakdown voltage transistor due to the retraction of the upper surface of the element isolation region EI, the reliability of the semiconductor device can be enhanced.

Here, when the MONOS memory, the capacitive element, and the high breakdown voltage transistor are mixedly mounted, it is considered that after forming the control gate electrode, the ONO film, and the memory gate electrode which configure the MONOS memory, the insulating film for the thick gate insulating film used in each of the capacitive element and the high breakdown voltage transistor, and the silicon film used as the gate electrode or the upper electrode, lying over the corresponding insulating film are formed. However, as will be described below, such a manufacturing process may lead to degradation in the performance of the semiconductor device and an increase in the manufacturing cost thereof.

That is, as described using FIG. 7, the polysilicon film PS1 to be the upper electrode of the capacitive element is not introduced with the impurity upon the film deposition, but implanted with the n-type impurity after the film deposition to become the n-type semiconductor film. This is because if the impurity is not diffused into the polysilicon film PS1, depletion occurs in the upper electrode (gate electrode) UE of the capacitive element, thereby reducing the capacity of the element.

Since, while it is necessary to perform heat treatment for the purpose of diffusing the impurity implanted into the polysilicon film PS1 into the polysilicon film PS1, a heat treatment process is further required to be added where the polysilicon film PS1 is formed by the above method after the formation of the ONO film, the manufacturing cost of the semiconductor device is increased. A problem however arises in that if the heat treatment process is not performed, the performance of the capacitive element is degraded due to the depletion of the upper electrode as described above. Incidentally, when the gate insulating film of the low breakdown voltage transistor is formed after the implantation of the impurity into the polysilicon film PS1, heat is applied to the semiconductor substrate SB, but its temperature is not enough for the corresponding impurity to be diffused into the polysilicon film PS1.

On the other hand, in the present embodiment, the polysilicon film PS1 to be the upper electrode UE (refer to FIG. 7) subsequently is formed, and the ONO film ON I formed at a high temperature as shown in FIG. 8 after the n-type impurity is implanted into the polysilicon film PS1. Thus, the n-type impurity in the polysilicon film PS1 (upper electrode UE) is diffused due to the heat at the deposition of the ONO film ON. Accordingly, since it is not necessary to add the heat treatment process as described above, it is possible to prevent the manufacturing cost of the semiconductor device from being increased. Further, it is possible to prevent a reduction in the capacity of the capacitive element CE (refer to FIG. 21) due to the depletion of the upper electrode UE.

Such an effect is not obtained when the polysilicon film PS1 is formed in the state of being introduced with the impurity upon the film deposition, i.e., when the doped polysilicon film is formed, but is effective in implanting the impurity into the polysilicon film PS1 after the deposition of the polysilicon film PS1. For example, when one part of upper electrodes UE formed in plural over the semiconductor substrate SB are formed as n-type semiconductor films and the other part thereof are formed as p-type semiconductor films, it is not possible to form the conductor film to be all upper electrodes by one process of forming the doped polysilicon film. Therefore, a process of separately implanting the impurities into the polysilicon film PS1 is required after the formation of the polysilicon film PS1.

Concerning Modification

A modification of the semiconductor device according to the present embodiment will hereinafter be described using FIG. 23. FIG. 23 is a plan diagram in the process of manufacturing a semiconductor chip showing the modification of the present embodiment.

The structure in which the memory cell area 1A, the capacitive element area 1B, and the high breakdown voltage transistor area 1C are respectively surrounded by the separate boundary areas 1D has been described in the plan diagram shown in FIG. 22. On the other hand, in the present modification, as seen in the plane as shown in FIG. 23, a memory cell area 1A and a partial high breakdown voltage transistor area 1C are surrounded by a first boundary area 1D, and a capacitive element area 1B and another partial high breakdown voltage transistor area 1C are surrounded by a second boundary area 1D.

Thus, in the present modification, the memory cell area 1A and the high breakdown voltage transistor area 1C are arranged adjacent to each other, and their peripheries are surrounded by the first boundary area 1D common thereto to thereby reduce the area to form the boundary area 1D. Similarly, the capacitive element area 1B and the high breakdown voltage transistor area 1C are arranged adjacent to each other, and their peripheries are surrounded by the second boundary area 1D common thereto to thereby reduce the area to form the boundary area 1D. It is thus possible to realize miniaturization of the semiconductor device. Incidentally, for example, the memory cell area 1A and the high breakdown voltage transistor area 1C may be surrounded by one boundary area 1D.

Embodiment 2

Figure 25:
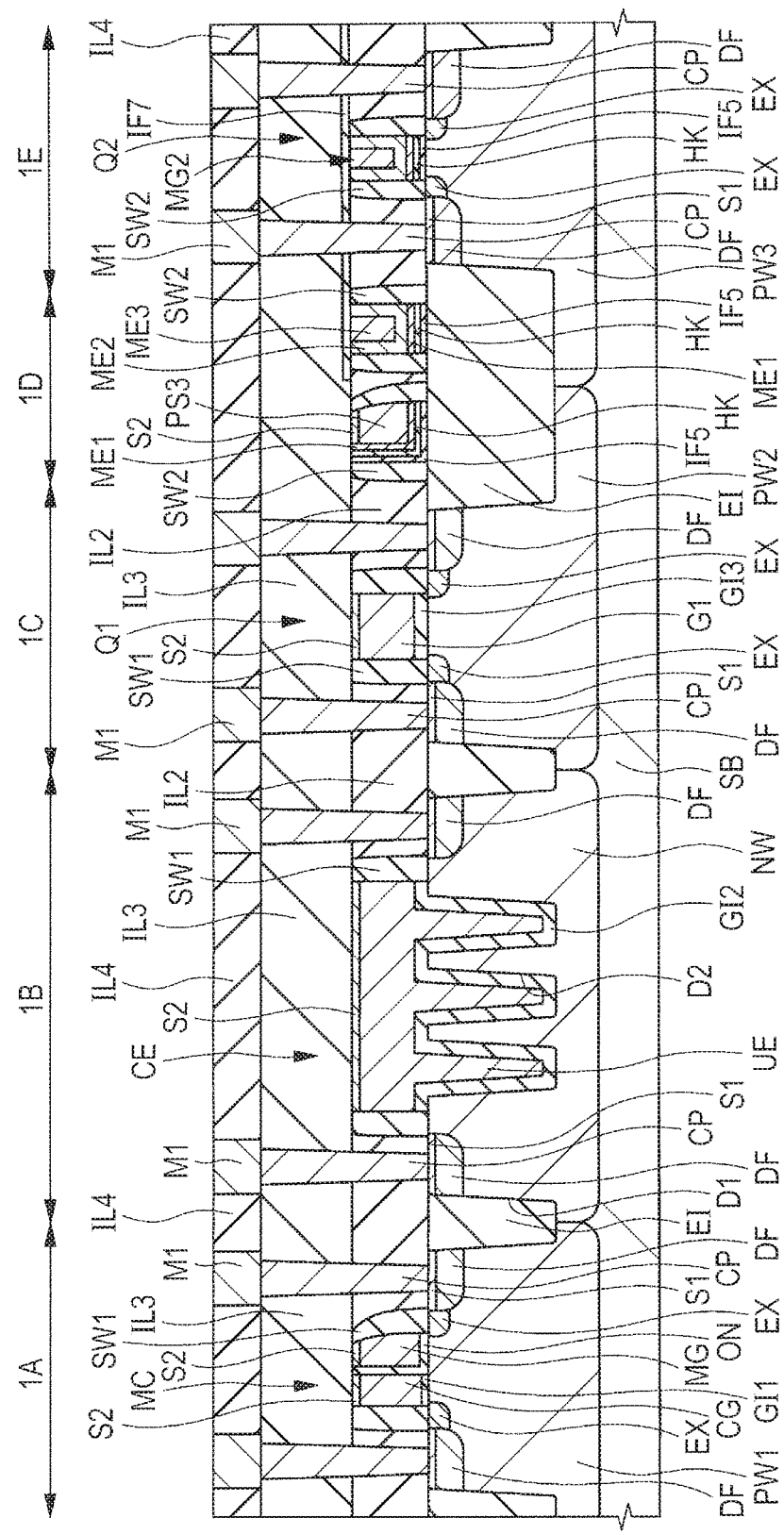
FIG. 25 is a sectional diagram in the process of manufacturing a semiconductor device showing an embodiment 2.

A process of manufacturing a semiconductor device according to an embodiment 2 will hereinafter be described using FIG. 25. FIG. 25 is a sectional diagram in the process of manufacturing the semiconductor device showing the present embodiment. Similarly to FIG. 1 through FIG. 21, FIG. 25 shows cross sections of a memory cell area 1A, a capacitive element area 1B, a high breakdown voltage transistor area 1C, a boundary area 1D, and a low breakdown voltage transistor area 1E.

Although the embodiment 1 has described the manufacturing process in which the gate electrode formed in the high breakdown voltage transistor area 1C is substituted with the metal gate electrode, a description will be made here of a case in which a high breakdown voltage transistor included a polysilicon film is formed without substitution of a gate electrode in the high breakdown voltage transistor area 1C.

In the present embodiment, processes similar to the processes described using FIG. 1 through FIG. 16 are first performed. Here, in the process described using FIG. 7, a polysilicon film PS1 to be a gate electrode of the high breakdown voltage transistor in a subsequent process is formed in a state of being not introduced with an impurity. Subsequently, in the n-type high breakdown voltage transistor area 1C shown in FIG. 7, an n-type impurity (e.g., P (phosphorus)) is implanted into the polysilicon film PS1, and a p-type impurity (e.g., B (boron)) is implanted into the polysilicon film PS1 in a forming area of a p-type high breakdown voltage transistor, which is a forming area of another high breakdown voltage transistor area 1C.

Thus, the p-type and n-type impurities are separately implanted into the polysilicon film PS1 using, for example, a photomask. Here, the n-type impurity is injected into the polysilicon film PS1 in each of the capacitive element area 1B and the high breakdown voltage transistor area 1C by the same ion implantation process. Similarly, the p-type impurity is injected into the polysilicon film PS1 in each of the capacitive element area 1B and the high breakdown voltage transistor area 1C by the same ion implantation process.

On the other hand, as in the above comparative example, it is considered that the silicon film for the upper electrode of the capacitive element and the silicon film for the gate electrode of the high breakdown voltage transistor are separately formed and separate ion implantation processes are performed on the silicon films to introduce the impurity. In this method, however, the manufacturing cost of the semiconductor device is increased because the ion implantation process is increased. Thus, in the present embodiment, the impurity is introduced into the polysilicon film PS1 in each of the capacitive element area 1B and the high breakdown voltage transistor area 1C by one ion implantation process to reduce the number of times that the ion implantation process is performed, thereby making it possible to reduce the manufacturing cost of the semiconductor device.

Thereafter, the above p-type and n-type impurities are diffused into the polysilicon film PS1 by heat generated in the process of forming the ONO film ON described using FIG. 8.

Further, in the process descried using FIG. 15, the source/drain regions each including the extension region EX and the diffusion layer DF are formed and thereby the high breakdown voltage MISFETQ1 having the source/drain regions and the gate electrode G1 lying over the gate insulating film GI13 is formed in the high breakdown voltage transistor area 1C.

Next, a process similar to the process described using FIG. 17 is performed to polish the upper surface of the interlayer insulating film IL2 and thereby expose the upper surface of each gate electrode, followed by removal of the dummy gate electrode DG (refer to FIG. 16). In the present embodiment, however, in a state in which the high breakdown voltage transistor area 1C is covered by the photoresist film PR2, the dummy gate electrode DG is removed and the gate electrode G1 in the high breakdown voltage transistor area 1C is left.

Next, processes similar to the processes described using FIG. 18 and FIG. 19 are performed. However, since the gate electrode G1 is not removed, the second trench is not formed and the metal films ME1 and ME2 are not left in the high breakdown voltage transistor area 1C. Next, the process described using FIG. 20 is performed. However, the insulating film IF7 is not formed in the high breakdown voltage transistor area 1C.

Next, as shown in FIG. 25, the semiconductor device according to the present embodiment is completed by performing a process similar to the process described using FIG. 21. Here, the silicide layer S2 is formed even over the upper surface of the gate electrode G1 which is not covered with the insulating film IF7.

The present embodiment is not capable of obtaining an advantage in the case where the metal gate electrode is formed, because the gate electrode G1 of the high breakdown voltage MISFETQ1 is configured by the polysilicon film other than the metal gate electrode, but capable of obtaining an effect similar to that of the embodiment 1 except for this point.

Further, as described above, when the p-type and n-type impurities are separately implanted into the polysilicon film PS1 after the formation of the polysilicon film PS1 upon performing a process similar to the process described using FIG. 7, and subsequently if the ONO film ON is formed as shown in FIG. 8, the semiconductor substrate SB is heated upon formation of the ONO film ON. Therefore, the n-type impurity in the polysilicon film PS1 (gate electrode G1) is diffused. Thus, since it is not necessary to add the heat treatment process for diffusing the impurities, it is possible to prevent an increase in the manufacturing cost of the semiconductor device. Further, it is possible to prevent a change in the characteristic of the MISFETQ1 due to the depletion of the gate electrode G1.

However, even when both of the p channel type high breakdown voltage transistor and the n channel type transistor are formed in the high breakdown voltage transistor area 1C, it is considered that in the process described using FIG. 7, the polysilicon film PS1 is formed in a state in which, for example, the n-type impurity is being introduced upon film deposition. In such a case, the effect of omitting the heat treatment process as described above cannot be obtained. That is, it is considered that the separate implantation of the impurity into the upper electrode UE in the capacitive element area 1B is not required and the gate electrode of the p channel type high breakdown voltage transistor is formed by the n-type polysilicon film PS1. In this case, no problem arises even though the ONO film ON is formed before the formation of the polysilicon film PS1.

Incidentally the p channel type high breakdown voltage transistor having the n-type gate electrode is operated as a so-called belit channel type transistor. The belit channel type transistor needs to adjust work functions as compared with the p channel type transistor having the p-type gate electrode, and the manufacturing process of the semiconductor device is likely to become complex.

Further, in the present embodiment, by not substituting the gate electrode G1 in the high breakdown voltage transistor area 1C with the metal gate electrode, a design rule related to its gate length, gate width, maximum area and local density can be relaxed. That is, when polishing is performed in the process described using FIG. 19 when performing the gate last process, dishing occurs when a metal gate electrode having a large area exists. The dishing mentioned herein indicates that due to the existence of a pattern easy to be scraped in the polishing process and large in area, and the like, the flatness of the polished surface is not maintained and a difference in height occurs in the surface.

Thus, in order to prevent the occurrence of the dishing, the metal gate electrode easy to be polished needs a severe restriction on the above design rule. In particular, the gate electrode of the high breakdown voltage transistor needs to make its gate length larger than that of the gate electrode of the low breakdown voltage transistor and hence becomes a large area. That is, when the gate electrode of the high breakdown voltage transistor is brought to the metal gate electrode, dishing is likely to occur. If a strict design rule is imposed to prevent it, the degree of freedom of the layout of the high breakdown voltage transistor is reduced.

On the other hand, in the present embodiment, since the gate electrode G1 is formed of the polysilicon film hard to be scraped more than the metal gate electrode in the polishing process, it is possible to relax the restrictions on the enlargement of the gate length and width, and the maximum area, and the local density due to a difference in polishing characteristics in the polishing process of FIG. 19. Thus, the same circuit function can be laid out in a smaller area, thereby making it possible to realize miniaturization of the semiconductor device and a reduction in the manufacturing cost of the semiconductor device.

Further, in the comparative example described using FIG. 26 through FIG. 32, the gate electrodes included polysilicon in the high breakdown voltage transistor and the low breakdown voltage transistor are respectively substituted with the metal gate electrode. It is however considered that in the high breakdown voltage transistor area 1C, for example, the gate electrode G1 (refer to FIG. 32) included polysilicon is left as the gate electrode of the high breakdown voltage transistor without performing substitution with the metal gate electrode as in the present embodiment. In this case, there is a need to implant either the n-type impurity or the p-type impurity or both thereof into the polysilicon film PS3 after the formation of the polysilicon film PS3 in the process described using FIG. 31.

At this time, since the impurity implantation process is performed in each of the process of forming the polysilicon film PS1 described using FIG. 26 and the process of forming the polysilicon film PS3 described using FIG. 31, the ion implantation process is increased. Further, when the n-type and p-type impurities are separately implanted in the respective forming processes of the polysilicon films PS1 and PS3, the process of forming a mask is also increased. Accordingly, the manufacturing cost of the semiconductor device is increased.

On the other hand, in the present embodiment, the polysilicon film PS1 (refer to FIG. 7) deposited to form the control gate electrode CG, upper electrode UE and gate electrode G1 shown in FIG. 21 is formed in one deposition process. Therefore, if the impurity is implanted into the deposited polysilicon film PS1 in the process described using FIG. 7, ion implantation is not required to be separately performed on the polysilicon film PS1 (refer to FIG. 26) configuring the control gate electrode CG and the upper electrode UE and the polysilicon film PS3 (refer to FIG. 31) configuring the gate electrode G1 as in the case where the gate electrode G1 is left in the above comparative example.

Thus, in the present embodiment, the ion implantation process can be reduced. Further, when the p-type and n-type impurities are implanted separately into the polysilicon film PS1, the number of masks (reticles) provided for the separate implantation can be reduced and the process of forming the photoresist pattern can also be omitted, as compared with the above comparative example. It is thus possible to reduce the manufacturing cost of the semiconductor device.

Although the invention made above by the present inventors has been described specifically on the basis of the embodiments therefor, the present invention is not limited to the embodiments referred to above. It is needless to say that various changes can be made to the embodiments within the scope not departing from the gist of the invention.

What is claimed is:
1. A method of manufacturing a semiconductor device, the method comprising:
(a) providing a semiconductor substrate including a main surface, the main surface including a first area and a second area, which is different from the first area in a plan view;
(b) forming a first trench in the main surface of the semiconductor substrate in the first area;
(c) after the (b), forming a first insulating film over the main surface of the semiconductor substrate and covering a side wall surface and a bottom face of the first trench;
(d) after the (c), forming a first conductor film over the main surface of the semiconductor substrate to embed a portion of the first conductor film into the first trench through the first insulating film;
(e) after the (d), patterning the first conductor film to remain a first part of the first conductor film as an upper electrode of a capacitor element in the first area and to remain a second part of the first conductor film over the first insulating film as a dummy gate electrode of a Metal Insulator Semiconductor Field Effect Transistor (MISFET) in the second area, the capacitor element including the first part with a portion embedded in the first trench, the first insulating film, and a part of the semiconductor substrate in the first area; and
(f) after the (e), replacing the second part of the first conductor film with a metal material to form a metal gate electrode of the MISFET.

2. The method according to claim 1, wherein the (h) forms the first trench and a second trench in the main surface of the semiconductor substrate and further includes (b1) embedding a second insulating film into the second trench to form an element isolation region including the second insulating film in the second trench.

3. The method according to claim 1, further comprising (d1) that includes, between the (d) and the (e), introducing an impurity of a first conductivity type or a second conductivity type into the first conductor film.

4. The method according to claim 1, wherein the (f) includes:
(f1) forming a second insulating film over the main surface of the semiconductor substrate to cover the upper electrode of the capacitor element and the dummy gate electrode of the MISFET;
(f2) polishing an upper surface of the second insulating film to expose upper surfaces of the upper electrode of the capacitor element and the dummy gate electrode of the MISFET;
(f3) removing the dummy gate electrode to form a second trench; and
(f4) that includes, after the f3, embedding the metal material inside the second trench to form the metal gate electrode of the MISFET.

5. The method according to claim 1, wherein a thickness of the first insulating film below the first part of the first conductor film is a same as a thickness of the first insulating film below the second part of the first conductor film.

6. The method according to claim 1, wherein a material of the first insulating film below the first part of the first conductor film is a same as a material of the first insulating film below the second part of the first conductor film.

7. The method according to claim 1, wherein, before the patterning of the first conductor film, the first insulating film is continuously disposed on the main surface of the semiconductor substrate from the first trench to the second area.

8. The method according to claim 1, wherein the first conductor film is disposed on a surface of the first insulating film in the first area and in the second area.

9. The method according to claim 1, wherein the first conductor film is disposed on a surface of the first insulating film in the first part of the first conductor film and in the second part of the first conductor film.

10. The method according to claim 1, wherein the first part of the first conductor film and the second part of the first conductor film abut the first insulating film.

11. The method according to claim 1, wherein the (f) includes:

forming a second insulating film over the main surface of the semiconductor substrate to cover the upper electrode of the capacitor element and the dummy gate electrode of the MISFET.

12. The method according to claim 11, wherein the (f) further includes:
   polishing an upper surface of the second insulating film to expose upper surfaces of the upper electrode of the capacitor element and the dummy gate electrode of the MISFET.

13. The method according to claim 11, wherein the (f) further includes:
   removing the dummy gate electrode to form a second trench.

14. The method according to claim 13, wherein the (f) further includes:
   embedding the metal material inside the second trench to form the metal gate electrode of the MISFET.

15. The method according to claim 1, wherein the (f) includes:
   removing the dummy gate electrode to form a second trench.

16. The method according to claim 15, wherein the (f) further includes:
   embedding the metal material inside the second trench to form the metal gate electrode of the MISFET.

17. The method according to claim 1, wherein, after the patterning of the first conductor film, the first insulating film remains between the main surface of the semiconductor substrate and the dummy gate electrode.

18. The method according to claim 1, wherein, after the patterning of the first conductor film, the first insulating film is disposed on the main surface of the semiconductor substrate and on a bottom surface of the dummy gate electrode.

19. The method according to claim 18, wherein, after the patterning of the first conductor film, the first insulating film is further disposed on a bottom surface of the first part of the first conductor film.

* * * * *